(12) United States Patent  
Nishigaki et al.

(10) Patent No.: US 12,224,250 B2  
(45) Date of Patent: Feb. 11, 2025

(54) ELECTROMAGNETIC WAVE ATTENUATOR, ELECTRONIC DEVICE, FILM FORMATION APPARATUS, AND FILM FORMATION METHOD

(71) Applicant: Shibaura Mechatronics Corporation, Yokohama (JP)

(72) Inventors: Hisashi Nishigaki, Yokohama (JP); Atsushi Fujita, Yokohama (JP); Shohei Tanabe, Yokohama (JP); Yoshinao Kamo, Yokohama (JP); Shigeki Matsunaka, Yokohama (JP)

(73) Assignee: SHIBAURA MECHATRONICS CORPORATION, Kanagawa (JP)

( * ) Notice: Subject to any disclaimer, the term of this patent is extended or adjusted under 35 U.S.C. 154(b) by 55 days.

(21) Appl. No.: 18/328,892

(22) Filed: Jun. 5, 2023

(65) Prior Publication Data

US 2023/0326875 A1     Oct. 12, 2023

Related U.S. Application Data

(62) Division of application No. 17/205,098, filed on Mar. 18, 2021, now Pat. No. 11,710,707.

(30) Foreign Application Priority Data

Mar. 26, 2020  (JP) .................................. 2020-055948  
Feb. 26, 2021  (JP) .................................. 2021-029613

(51) Int. Cl.  
*H05K 9/00*      (2006.01)  
*C23C 14/34*     (2006.01)  
(Continued)

(52) U.S. Cl.  
CPC ........ *H01L 23/552* (2013.01); *C23C 14/3464* (2013.01); *H01F 10/265* (2013.01);  
(Continued)

(58) Field of Classification Search  
CPC .......................... C23C 14/3461; H05K 9/0088  
See application file for complete search history.

(56) References Cited

U.S. PATENT DOCUMENTS

2008/0088980 A1   4/2008   Kitagawa et al.  
2011/0139606 A1   6/2011   Tsunekawa et al.  
(Continued)

FOREIGN PATENT DOCUMENTS

CN      101162756 A      4/2008  
CN      103392389 A      11/2013  
(Continued)

*Primary Examiner* — Hung V Ngo  
(74) *Attorney, Agent, or Firm* — McDonald Hopkins LLC

(57) ABSTRACT

According to one embodiment, an electromagnetic wave attenuator includes a first structure body. The first structure body includes a first member, a second member, and a third member. The first member includes a first magnetic layer and a first nonmagnetic layer alternately provided in a first direction. The first nonmagnetic layer is conductive. The first direction is a stacking direction. The second member includes a second magnetic layer and a second nonmagnetic layer alternately provided in the first direction. The second nonmagnetic layer is conductive. The third member includes a third nonmagnetic layer. The third nonmagnetic layer is conductive. A direction from the third member toward the first member is along the first direction. A direction from the third member toward the second member is along the first direction. A first magnetic layer thickness is greater than a second magnetic layer thickness.

15 Claims, 11 Drawing Sheets

(51) Int. Cl.
  *H01F 10/26*   (2006.01)
  *H01F 10/30*   (2006.01)
  *H01L 23/00*   (2006.01)
  *H01L 23/552*  (2006.01)
(52) U.S. Cl.
  CPC ............ H01F 10/30 (2013.01); H01L 24/32 (2013.01); H05K 9/0088 (2013.01); *H01L 2224/32225* (2013.01); *H01L 2924/3025* (2013.01)

(56) References Cited

U.S. PATENT DOCUMENTS

| | | |
|---|---|---|
| 2013/0284511 A1 | 10/2013 | Kagawa |
| 2016/0007510 A1 | 1/2016 | Cheng |
| 2020/0227358 A1 | 7/2020 | Kikitsu et al. |
| 2020/0243457 A1 | 7/2020 | Kikitsu et al. |
| 2021/0360839 A1 | 11/2021 | Yamada et al. |
| 2022/0127715 A1* | 4/2022 | Chen ................. C23C 14/54 |
| 2022/0223390 A1* | 7/2022 | Shinada ............. H01J 37/3447 |
| 2023/0002886 A1* | 1/2023 | Yakushiji ........... C23C 14/5873 |
| 2023/0144255 A1* | 5/2023 | Zhang ................ C23C 28/04 |
| | | 428/215 |
| 2023/0220539 A1* | 7/2023 | Rendall .............. C23C 14/14 |
| | | 204/192.2 |
| 2023/0257868 A1* | 8/2023 | Yang ................. C23C 14/024 |

FOREIGN PATENT DOCUMENTS

| | | |
|---|---|---|
| JP | 2012-038807 A | 2/2012 |
| TW | 200423071 A | 11/2004 |
| TW | 201001458 A1 | 1/2010 |

\* cited by examiner

ELECTROMAGNETIC WAVE ATTENUATOR, ELECTRONIC DEVICE, FILM FORMATION APPARATUS, AND FILM FORMATION METHOD

CROSS-REFERENCE TO RELATED APPLICATIONS

This is a divisional of U.S. patent application Ser. No. 17/205,098 filed on Mar. 18, 2021, which claims the benefit of priority from Japanese Patent Application No. 2020-055948, filed on Mar. 26, 2020, and Japanese Patent Application No. 2021-029613, filed on Feb. 26, 2021; the entire contents of which are incorporated herein by reference.

FIELD

Embodiments described herein relate generally to an electromagnetic wave attenuator, an electronic device, a film formation apparatus, and a film formation method.

BACKGROUND

For example, an electromagnetic wave attenuator such as an electromagnetic shield sheet or the like has been proposed. There is an electronic device that includes the electromagnetic wave attenuator and a semiconductor element. It is desirable to improve the attenuation characteristics of the electromagnetic wave attenuator for electromagnetic waves.

DETAILED DESCRIPTION

Figure 1A:
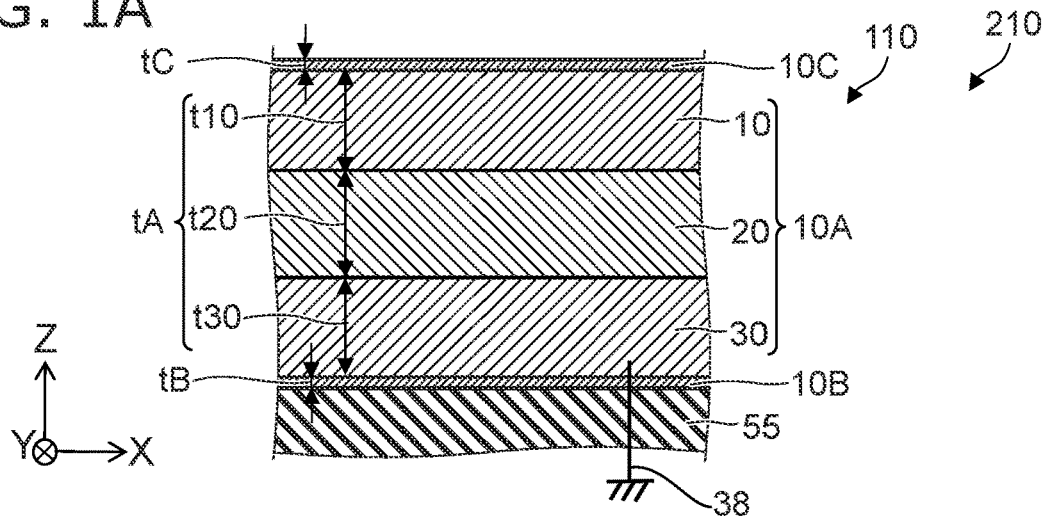
FIGS. 1A to 1D are schematic cross-sectional views illustrating an electromagnetic wave attenuator according to a first embodiment.

According to one embodiment, an electromagnetic wave attenuator includes a first structure body. The first structure body includes a first member, a second member, and a third member. The first member includes a first magnetic layer and a first nonmagnetic layer. The first magnetic layer and the first nonmagnetic layer are alternately provided in a first direction. The first nonmagnetic layer is conductive. The first direction is a stacking direction. The second member includes a second magnetic layer and a second nonmagnetic layer. The second magnetic layer and the second nonmagnetic layer are alternately provided in the first direction. The second nonmagnetic layer is conductive. The third member includes a third nonmagnetic layer. The third nonmagnetic layer is conductive. A direction from the third member toward the first member is along the first direction. A direction from the third member toward the second member is along the first direction. A first magnetic layer thickness is greater than a second magnetic layer thickness. The first magnetic layer thickness is a thickness along the first direction of the first magnetic layer. The second magnetic layer thickness is a thickness along the first direction of the second magnetic layer.

According to one embodiment, an electromagnetic wave attenuator includes a first structure body. The first structure body includes a first member, a second member, and a third member. The first member includes a first magnetic layer and a first nonmagnetic layer. The first magnetic layer and the first nonmagnetic layer are alternately provided in a first direction. The first nonmagnetic layer is conductive. The first direction is a stacking direction. The second member includes a second magnetic layer and a second nonmagnetic layer. The second magnetic layer and the second nonmagnetic layer are alternately provided in the first direction. The second nonmagnetic layer is conductive. The third member includes a third nonmagnetic layer. The third nonmagnetic layer is conductive. A direction from the third member toward the first member is along the first direction. A direction from the third member toward the second member is along the first direction. A crystallinity of at least a portion of the first magnetic layer is greater than a crystallinity of at least a portion of the second magnetic layer.

According to one embodiment, a film formation apparatus includes a container, a first film formation part, a second film formation part, and a third film formation part, and a controller. The container is configured to maintain an atmosphere depressurized from atmospheric pressure. The first, second, and third film formation parts are provided in the container. The first, second, and third film formation parts include a sputter source to form an electromagnetic wave attenuator by depositing a film formation material on a processing body by sputtering. The controller controls the first, second, and third film formation parts. The electromagnetic wave attenuator includes a first structure body. The first structure body includes a first member, and a second member. The first member includes a plurality of first magnetic layers and a plurality of first nonmagnetic layers. One of the plurality of first nonmagnetic layers is between the plurality of first magnetic layers. The second member includes a plurality of second magnetic layers and a plurality of second nonmagnetic layers. One of the plurality of second nonmagnetic layers is between the plurality of second magnetic layers. A thickness of one of the plurality of first magnetic layers is greater than a thickness of one of the plurality of second magnetic layers. When forming the first structure body, the controller causes the second film formation part to form an other portion of the one of the plurality of first magnetic layers after causing the first film formation part to form a portion of the one of the plurality of first magnetic layers, or causes the first film formation part to form one of the plurality of first magnetic layers and causes the second film formation part to form an other one of the plurality of first magnetic layers, and causes the third film formation part to form the plurality of first nonmagnetic layers.

According to one embodiment, a film formation method is disclosed. The method includes forming a first structure body. The first structure body includes a first member, and a second member. The first member includes a plurality of first magnetic layers and a plurality of first nonmagnetic layers. One of the plurality of first nonmagnetic layers is between the plurality of first magnetic layers. The second member includes a plurality of second magnetic layers and a plurality of second nonmagnetic layers. One of the plurality of second nonmagnetic layers is between the plurality of second magnetic layers. A thickness of one of the plurality of first magnetic layers is greater than a thickness of one of the plurality of second magnetic layers. The method can include, when forming the first structure body, forming an other portion of the one of the plurality of first magnetic layers at the second film formation part after forming a portion of the one of the plurality of first magnetic layers at the first film formation part, or forming one of the plurality of first magnetic layers at the first film formation part and forming an other one of the plurality of first magnetic layers at the second film formation part. The method can include forming the plurality of first nonmagnetic layers at the third film formation part. The method can include forming one of the plurality of second magnetic layers at one of the first film formation part or the second film formation part. In addition, the method can include forming the plurality of second nonmagnetic layers at the third film formation part.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIGS. 1A to 1D are schematic cross-sectional views illustrating an electromagnetic wave attenuator according to a first embodiment.

Figure 2:
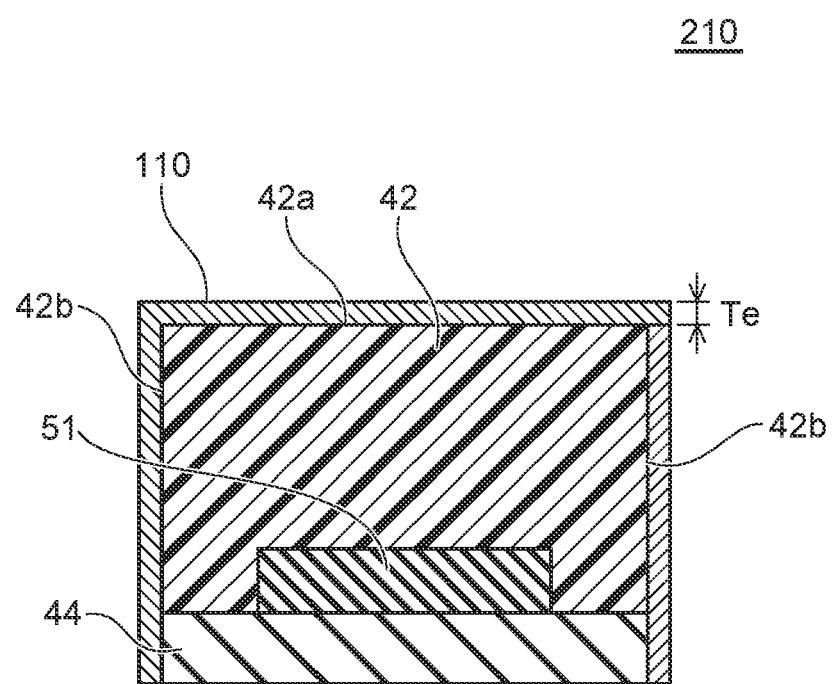
FIG. 2 is a schematic cross-sectional view illustrating an electronic device according to the embodiment.
Figure 3A:
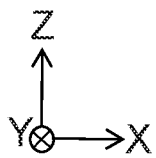
FIGS. 3A to 3F are schematic cross-sectional views illustrating the electromagnetic wave attenuator according to the first embodiment.
Figure 3A:
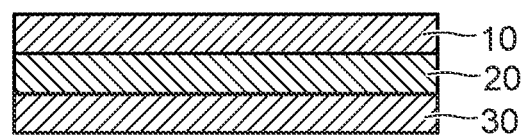
Figure 3B:
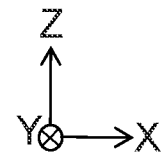
Figure 3B:
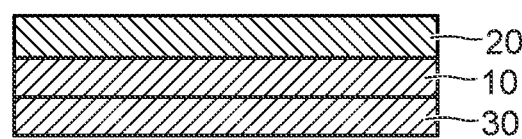
Figure 3C:
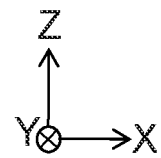
Figure 3C:
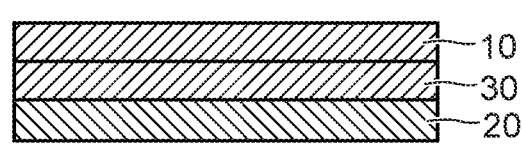
Figure 3D:
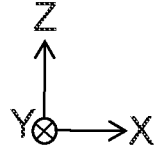
Figure 3D:
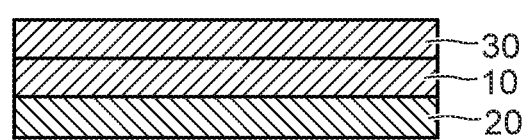
Figure 3E:
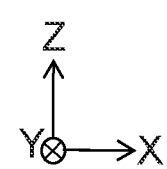
Figure 3E:
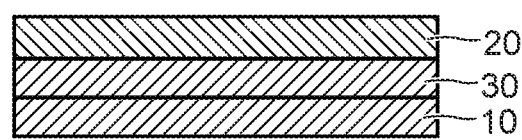
Figure 3F:
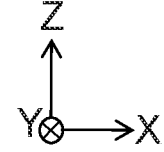
Figure 3F:
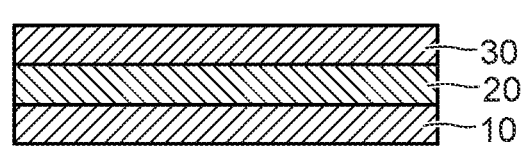

FIG. 2 is a schematic cross-sectional view illustrating an electronic device according to the embodiment.

As shown in FIG. 1A, the electromagnetic wave attenuator 110 according to the embodiment is used in the electronic device 210. The electronic device 210 according to the embodiment includes the electromagnetic wave attenuator 110 and a base body 55.

As shown in FIG. 2, in the electronic device 210 according to the embodiment, the electromagnetic wave attenuator 110 is formed on a top surface 42a and a side surface 42b of a package 42 in which an electronic element 51 is sealed. The package 42 in which the electronic element 51 is sealed is an example of the base body 55. To obtain the attenuation effect, it is sufficient for the electromagnetic wave attenuator 110 to be formed on at least the top surface 42a of the package 42. The electromagnetic wave attenuator 110 that is on the side surface 42b is for grounding. The top surface 42a of the package 42 is the outer surface at the side opposite to the surface that is mounted to the product. The top surface 42a is the upper surface at the highest position when placed horizontally. The top surface 42a may or may not be oriented upward when mounted. The side surface 42b is an outer perimeter surface that is formed at a different angle from the top surface 42a. A corner may be formed between the top surface 42a and the side surface 42b, or a curved surface may be continuous between the top surface 42a and the side surface 42b.

The electronic element 51 is a surface-mount component such as a semiconductor chip, a diode, a transistor, a capacitor, a SAW filter, etc. In the description hereinbelow, a semiconductor chip is used as an example of the electronic element 51. Here, the semiconductor chip is configured as an integrated circuit in which multiple electronic elements are integrated. For convenience of description of the manufacturing apparatuses and the manufacturing processes hereinbelow, components may be called the electronic device 210 even when in a state before the electromagnetic wave attenuator 110 is formed.

The electronic element 51 is mounted to a surface of a substrate 44. In the substrate 44, a circuit pattern is formed at the surface of a plate made of a ceramic, glass, an epoxy resin, etc. The electronic element 51 and the circuit pattern are connected by solder.

The package 42 is configured by sealing the surface of the substrate 44 on which the electronic element 51 is mounted with a synthetic resin to cover the electronic element 51. The package 42 is a substantially rectangular parallelepiped. The electromagnetic wave attenuator 110 is a film that shields electromagnetic waves.

For example, electromagnetic waves are generated in the electronic element 51. The electromagnetic wave attenuator 110 attenuates the electromagnetic waves and suppresses the emission of the electromagnetic waves to the outside. For example, the electromagnetic wave attenuator 110 prevents electromagnetic waves from reaching the electronic element 51 from the outside. For example, as shown in FIG. 1A, the electromagnetic wave attenuator 110 is stacked with the electronic element 51.

As shown in FIG. 1A, the electromagnetic wave attenuator 110 includes a first structure body 10A. The first structure body 10A includes a first member 10, a second member 20, and a third member 30.

Figure 1B:
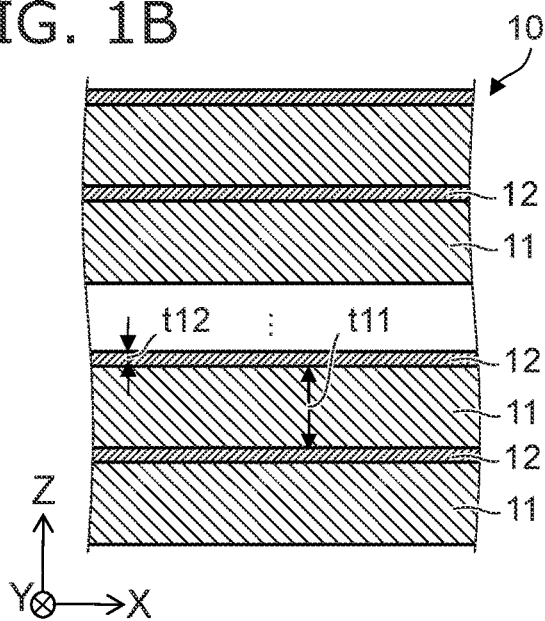

As shown in FIG. 1B, the first member 10 includes a first magnetic layer 11 and a conductive first nonmagnetic layer 12 that are alternately provided in a first direction, which is described below. For example, multiple first magnetic layers 11 and multiple conductive first nonmagnetic layers 12 are provided. One of the multiple first nonmagnetic layers 12 is located between one of the multiple first magnetic layers 11 and another one of the multiple first magnetic layers 11. One of the multiple first magnetic layers 11 is located between one of the multiple first nonmagnetic layers 12 and another one of the multiple first nonmagnetic layers 12.

The first direction is taken as a Z-axis direction. One direction perpendicular to the Z-axis direction is taken as an X-axis direction. A direction perpendicular to the Z-axis direction and the X-axis direction is taken as a Y-axis direction.

Figure 1C:
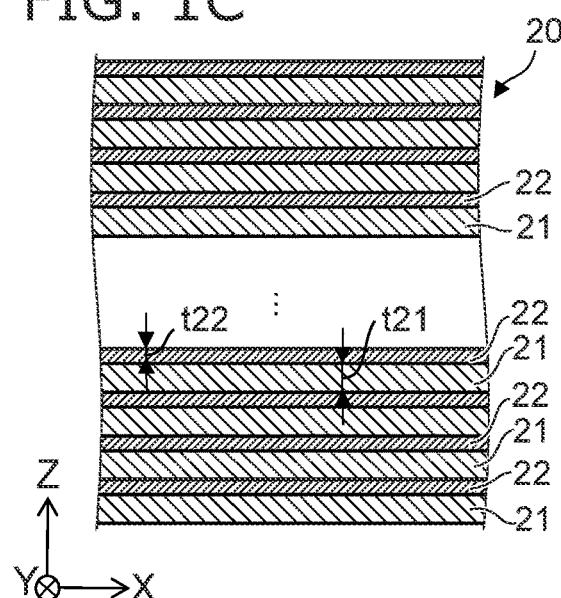

As shown in FIG. 1C, the second member 20 includes a second magnetic layer 21 and a conductive second nonmagnetic layer 22 that are alternately provided in the first direction (the Z-axis direction). For example, multiple second magnetic layers 21 and multiple conductive second nonmagnetic layers 22 are provided. One of the multiple second nonmagnetic layers 22 is located between one of the multiple second magnetic layers 21 and another one of the multiple second magnetic layers 21. One of the multiple second magnetic layers 21 is located between one of the multiple second nonmagnetic layers 22 and another one of the multiple second nonmagnetic layers 22.

Figure 1D:
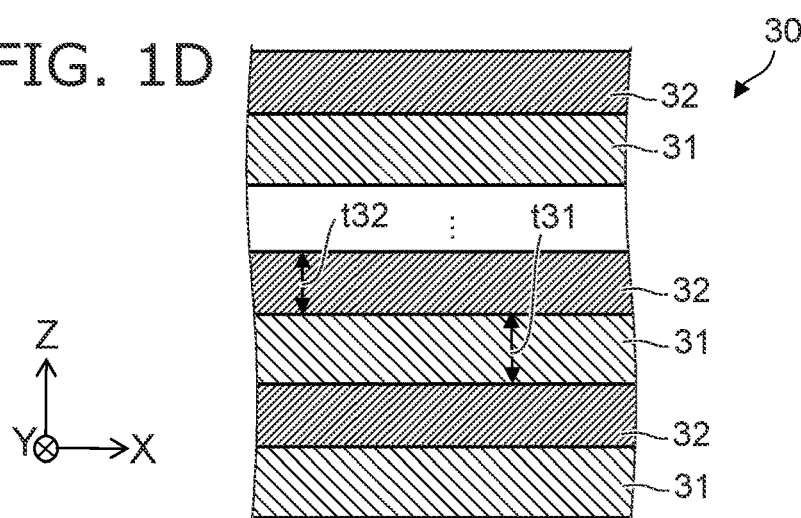

As shown in FIG. 1D, the third member 30 includes a conductive third nonmagnetic layer 32. In the example, the third member 30 further includes a third magnetic layer 31. The direction from the third magnetic layer 31 toward the third nonmagnetic layer 32 is along the first direction (the Z-axis direction). In the example, for example, multiple third magnetic layers 31 and multiple conductive third nonmagnetic layers 32 are provided. One of the multiple third nonmagnetic layers 32 is located between one of the multiple third magnetic layers 31 and another one of the multiple third magnetic layers 31. One of the multiple third magnetic layers 31 is located between one of the multiple third nonmagnetic layers 32 and another one of the multiple third nonmagnetic layers 32.

As shown in FIG. 1A, the electromagnetic wave attenuator 110 may further include a second structure body 10B. The direction from the second structure body 10B toward the first structure body 10A is along the first direction (the Z-axis direction). The second structure body 10B includes, for example, Fe and at least one of Cr or Ni. The second structure body 10B may include, for example, stainless steel. In the example, the second structure body 10B is located between the base body 55 and the first structure body 10A. In such a case, for example, the second structure body 10B functions as a foundation layer.

As shown in FIG. 1A, the electromagnetic wave attenuator 110 may further include a third structure body 10C. The first structure body 10A is between the second structure body 10B and the third structure body 10C in the first direction (the Z-axis direction). The third structure body 10C includes, for example, Fe and at least one of Cr or Ni. The third structure body 10C may include, for example, stainless steel. For example, the third structure body 10C functions as a protective layer. For example, the third structure body 10C functions as an oxidation suppression layer.

In one example as shown in FIG. 1A, the direction from the third member 30 toward the first member 10 is along the first direction (the Z-axis direction). In one example, the direction from the third member 30 toward the second member 20 is along the first direction (the Z-axis direction). For example, the first direction (the Z-axis direction) corresponds to the stacking direction.

The multiple first magnetic layers 11 and the multiple first nonmagnetic layers 12 spread along the X-Y plane. The multiple second magnetic layers 21 and the multiple second nonmagnetic layers 22 spread along the X-Y plane. The third magnetic layer 31 and the third nonmagnetic layer 32 spread along the X-Y plane.

As shown in FIG. 1A, for example, the electromagnetic wave attenuator 110 may be electrically connected to ground. For example, the third member 30 may be connected to ground by a conductive member 38, etc.

FIGS. 3A to 3F are schematic cross-sectional views illustrating the electromagnetic wave attenuator according to the first embodiment.

As shown in FIGS. 3A to 3F, the sequence of the first member 10, the second member 20, and the third member 30 is arbitrary. For example, in one example, the second member 20 is between the first member 10 and the third member 30 (referring to FIGS. 3A and 3F). In another example, the first member 10 is between the second member 20 and the third member 30 (referring to FIGS. 3B and 3D). In another example, the third member 30 is between the first member 10 and the second member 20 (referring to FIGS. 3C and 3E).

As shown in FIG. 1B, the thickness (the length) along the first direction (the Z-axis direction) of the first magnetic layer 11 is taken as a first magnetic layer thickness t11. The thickness (the length) along the first direction of the first nonmagnetic layer 12 is taken as a first nonmagnetic layer thickness t12. For example, the sum of the product of the first magnetic layer thickness t11 and the number of the multiple first magnetic layers 11 and the product of the first nonmagnetic layer thickness t12 and the number of the multiple first nonmagnetic layers 12 corresponds to a first member thickness t10 along the first direction of the first member 10 (referring to FIG. 1A).

As shown in FIG. 1C, the thickness (the length) along the first direction (the Z-axis direction) of the second magnetic layer 21 is taken as a second magnetic layer thickness t21. The thickness (the length) along the first direction of the second nonmagnetic layer 22 is taken as a second nonmagnetic layer thickness t22. For example, the sum of the product of the second magnetic layer thickness t21 and the number of the multiple second magnetic layers 21 and the product of the second nonmagnetic layer thickness t22 and the number of the multiple second nonmagnetic layers 22 corresponds to a second member thickness t20 along the first direction of the second member 20 (referring to FIG. 1A).

As shown in FIG. 1D, the thickness (the length) along the first direction (the Z-axis direction) of the third magnetic layer 31 is taken as a third magnetic layer thickness t31. The thickness (the length) along the first direction of the third nonmagnetic layer 32 is taken as a third nonmagnetic layer thickness t32. For example, the sum of the product of the third magnetic layer thickness t31 and the number of the multiple third magnetic layers 31 and the product of the third nonmagnetic layer thickness t32 and the number of the multiple third nonmagnetic layers 32 corresponds to a third member thickness t30 along the first direction of the third member 30 (referring to FIG. 1A).

As shown in FIG. 1A, the sum of the first member thickness t10, the second member thickness t20, and the third member thickness t30 corresponds to a first structure body thickness tA along the first direction of the first structure body 10A. The thickness along the first direction of the second structure body 10B is taken as a second structure body thickness tB. The thickness along the first direction of the third structure body 10C is taken as a third structure body thickness tC. For example, the sum of the first structure body thickness tA, the second structure body thickness tB, and the third structure body thickness tC corresponds to the thickness of the electromagnetic wave attenuator 110 (a thickness Te of FIG. 2).

According to the embodiment, for example, the first magnetic layer thickness t11 is greater than the second magnetic layer thickness t21. According to the embodiment, for example, the crystallinity of at least a portion of the first magnetic layer 11 is greater than the crystallinity of at least a portion of the second magnetic layer 21. As described below, it was found that electromagnetic waves can be more effectively attenuated by the electromagnetic wave attenuator 110 including such first and second magnetic layers 11 and 21.

Examples of characteristics of the electromagnetic wave attenuator will now be described.

A first sample has the following configuration. In the first sample, the second structure body 10B includes stainless steel. The second structure body thickness tB is about 100 nm.

In the first sample, the third member 30 is located on the second structure body 10B. The third member 30 includes the multiple third magnetic layers 31 and the multiple third nonmagnetic layers 32. The number of the multiple third magnetic layers 31 is 10; and the number of the multiple third nonmagnetic layers 32 is 10. The multiple third magnetic layers 31 are NiFeCuMo layers. The multiple third nonmagnetic layers 32 are Cu layers. The third magnetic layer thickness t31 is 100 nm. The third nonmagnetic layer thickness t32 is 100 nm. The third member thickness t30 is about 2 µm.

In the first sample, the second member 20 is located on the third member 30. The second member 20 includes the multiple second magnetic layers 21 and the multiple second nonmagnetic layers 22. The number of the multiple second magnetic layers 21 is 40; and the number of the multiple second nonmagnetic layers 22 is 40. The multiple second magnetic layers 21 are NiFeCuMo layers. The multiple second nonmagnetic layers 22 are Ta layers. The second magnetic layer thickness t21 is 50 nm. The second nonmagnetic layer thickness t22 is 5 nm. The second member thickness t20 is about 2 µm.

In the first sample, the first member 10 is located on the second member 20. The first member 10 includes the multiple first magnetic layers 11 and the multiple first nonmagnetic layers 12. The number of the multiple first magnetic layers 11 is 7; and the number of the multiple first nonmagnetic layers 12 is 7. The multiple first magnetic layers 11 are NiFeCuMo layers. The multiple first nonmagnetic layers 12 are Ta layers. The first magnetic layer thickness t11 is 300 nm. The first nonmagnetic layer thickness t12 is 5 nm. The first member thickness t10 is about 2 µm.

In the first sample, the third structure body 10C is located on the first member 10. The third structure body 10C includes stainless steel. The third structure body thickness tC is about 300 nm. The thickness of the first sample is about 6.4 µm.

The composition of the NiFeCuMo layers described above is Ni:Fe:Cu:Mo=77:14:5:4 (atomic %).

The first member 10 is not provided in a second sample. In the second sample, the number of the multiple second magnetic layers 21 is 73; and the number of the multiple second nonmagnetic layers 22 is 73. The multiple second magnetic layers 21 are NiFeCuMo layers. The multiple second nonmagnetic layers 22 are Ta layers. The second magnetic layer thickness t21 is 50 nm. The second nonmagnetic layer thickness t22 is 5 nm. The second member thickness t20 is about 4 µm. Otherwise, the configuration of the second sample is similar to the configuration of the first sample.

A voltage (dBµV) was measured as the attenuation characteristics for electromagnetic waves for such first and second samples. That is, $20 \times \log_{10}$ (voltage/1 µV when the electromagnetic wave attenuator exists) was measured. For example, the attenuation effect (dBµV) of electromagnetic waves at a frequency of 170 kHz, that is, a voltage when the electromagnetic wave attenuator exists is measured. As a result of the measurement, the attenuation effect of the first sample was −2.4 (dBµV). On the other hand, the attenuation effect of the second sample at a frequency of 170 kHz was −2.1 (dBµV). The attenuation effect and attenuation characteristics increase as the absolute value of (dBµV) increases.

Thus, a higher attenuation effect than the second sample is obtained in the first sample. The thickness of the first sample is substantially equal to the thickness of the second sample; therefore, it is considered that the difference between the second member 20 and the first member 10 provided in the first sample has a relationship with the attenuation effect.

There is a possibility that the attenuation effect difference between the first sample and the second sample has a relationship with a crystallinity difference between the magnetic layers of these samples. For example, in the first sample, the crystallinity of at least a portion of the first magnetic layer 11 is higher than the crystallinity of at least a portion of the second magnetic layer 21. "High crystallinity" means, e.g., that crystallization is progressed. "High crystallinity" means, e.g., that a region with a crystal structure occupies a high proportion in a certain region (for example, not less than 50%). "High crystallinity" means, e.g., that a certain region includes multiple crystal grains. "Low crystallinity" means, e.g., that crystallization is not progressed. "Low crystallinity" means, e.g., that a region with a crystal structure occupies a low proportion in a certain region (for example, less than 50%). A state of "low crystallinity" includes, e.g., amorphous state (non-crystalline).

Examples of the crystallinity will now be described.

FIGS. 4A to 4D are schematic views illustrating the electromagnetic wave attenuator according to the first embodiment.

Figure 4A:
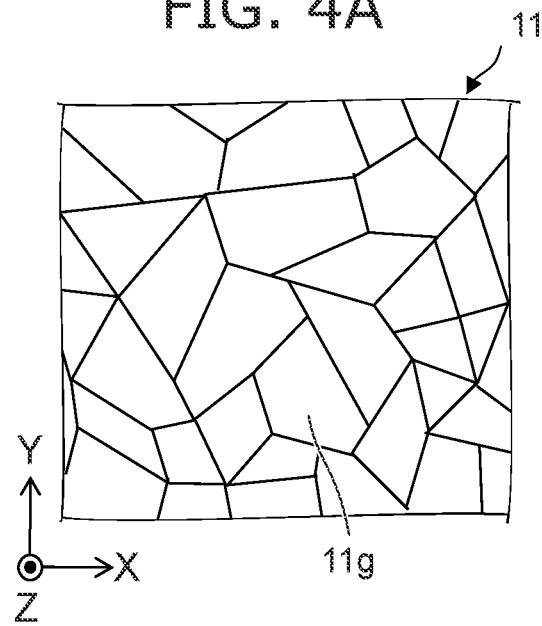
FIGS. 4A to 4D are schematic views illustrating the electromagnetic wave attenuator according to the first embodiment.
Figure 4B:
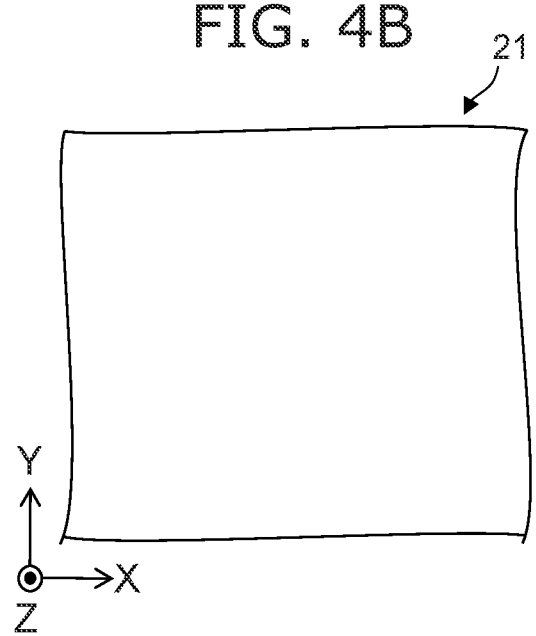
Figure 4C:
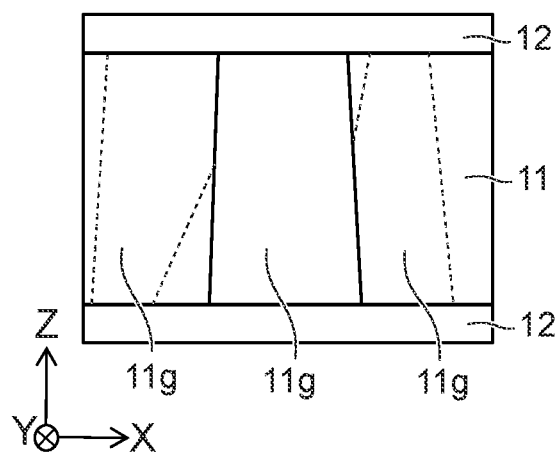
Figure 4D:
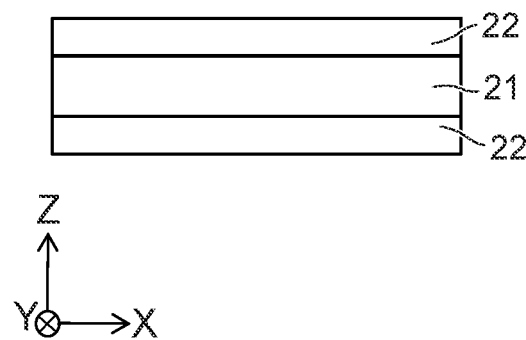

FIGS. 4A and 4C illustrate the state of the first magnetic layer 11. FIGS. 4B and 4D illustrate the state of the second magnetic layer 21.

As shown in FIGS. 4A and 4C, at least a portion of the first magnetic layer 11 includes a first crystal grain 11g.

As shown in FIGS. 4B and 4D, in the embodiment, at least a part of the second magnetic layer 21 may not include crystal grains.

Thus, at least a portion of the first magnetic layer 11 may be a crystal; and at least a portion of the second magnetic layer 21 may be amorphous. Crystal grains are not observed in the amorphous portion of the second magnetic layer 21.

For the first magnetic layer 11 that has higher crystallinity than the second magnetic layer 21 such as that described above, the magnetic permeability of the first magnetic layer 11 is less than the magnetic permeability of the second magnetic layer 21 such as that described above. It is considered that the attenuation characteristics of the electromagnetic waves are improved by using multiple magnetic layers having different magnetic permeabilities. The reason is considered to be that the magnetic permeability and the coercivity have a negative correlation; therefore, for example, the first magnetic layer 11 that has a low magnetic permeability has a large coercivity. Then, it is considered that because the magnetic permeability of the first magnetic layer 11 is less than the magnetic permeability of the second magnetic layer 21, the coercivity of the first magnetic layer 11 is greater than the coercivity of the second magnetic layer 21 that has a higher magnetic permeability than the first magnetic layer 11. For example, it is considered that because the coercivity of the first magnetic layer 11 is large, the high-power (high magnetic-field) component of the electromagnetic waves is effectively attenuated. Accordingly, when a large high-power (high magnetic-field intensity) component of the electromagnetic waves that become noise is included, the electromagnetic waves that become noise are effectively attenuated by the first magnetic layer 11. On the other hand, when the power (the magnetic field intensity) is low, the attenuation effect increases as the magnetic permeability increases. Therefore, when a large low-power (low-magnetic field intensity) component of the electromagnetic waves that become noise is included, this component is effectively attenuated by the second magnetic layer 21. Therefore, it is considered that a high attenuation effect can be maintained by using multiple magnetic layers having different magnetic permeabilities even when the distribution of the power (the magnetic field intensity) is wide. It is considered that this high attenuation effect has a relationship with obtaining high attenuation characteristics in the first sample compared to the second sample.

Information relating to the crystallinity of the first and second magnetic layers 11 and 21 is obtained by, for example, a TEM (Transmission Electron Microscope) image, etc. For example, the information relating to the crystallinity of the first and second magnetic layers 11 and 21 is obtained by an X-ray diffraction image, etc. "The crystal grain is not observed" recited above means that information relating to the crystallinity is not obtained; when observing using an X-ray diffraction image, for example, this means that a peak is not observed.

Figure 5:
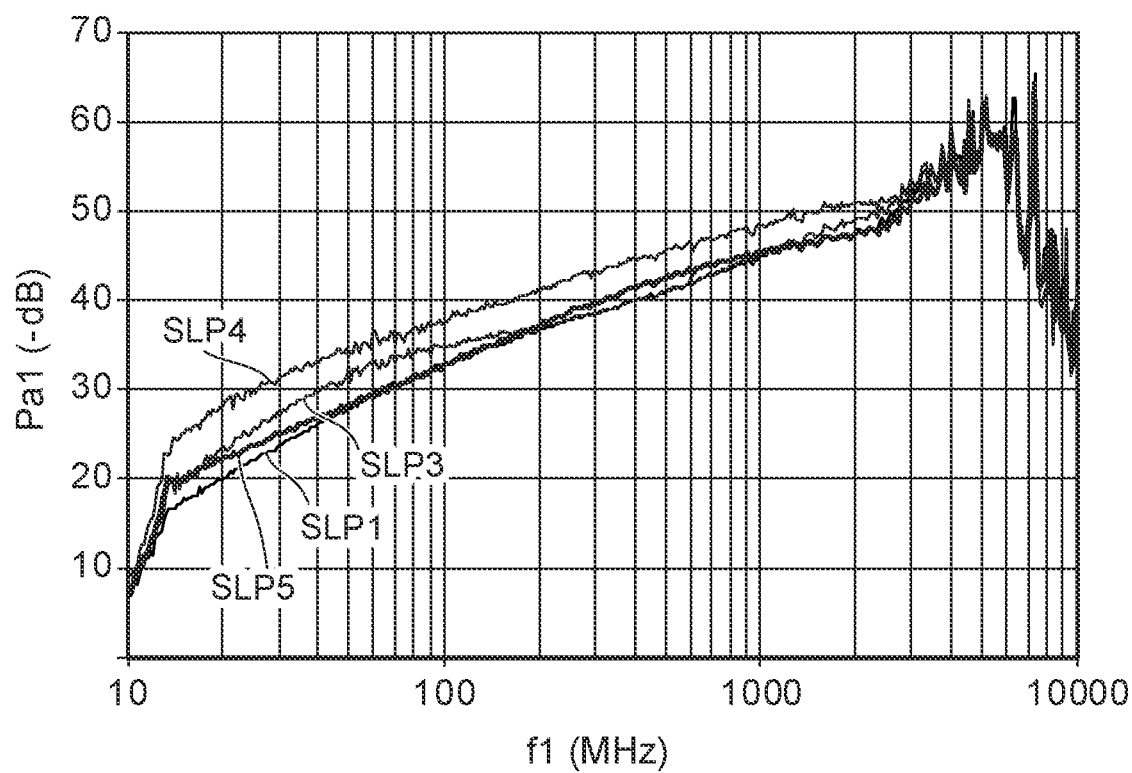
FIG. 5 is a graph illustrating characteristics of the electromagnetic wave attenuator.

FIG. 5 is a graph illustrating characteristics of the electromagnetic wave attenuator.

The horizontal axis of FIG. 5 is a frequency f1. The vertical axis of FIG. 5 is a parameter Pa1 corresponding to the attenuation effect of the electromagnetic waves. A large parameter Pa1 corresponds to a high attenuation effect and good attenuation characteristics. The parameter Pa1 corresponds to the attenuation effect (−dB) of the electromagnetic waves at the frequency f1 of 10 MHz to 10 GHz. The parameter Pa1 indicates how much the electromagnetic waves are attenuated, and is obtained using the measurement results of the electric field intensity when the electromagnetic wave attenuator exists and the electric field intensity when the electromagnetic wave attenuator does not exist. For this measurement, an electrical wire generating the electromagnetic wave at a desired frequency by energizing a current and a measurement device with a probe sensing the electric field intensity were used. In (−dB) of FIG. 5, minus before numerical value is shifted in front of unit dB. For example, 20 (−dB) is the same as −20 (dB).

Other than the characteristic of the first sample SPL1 described above, FIG. 5 illustrates measurement results of characteristics of a third sample SPL3, a fourth sample SPL4, and a fifth sample SPL5.

In the third sample SPL3, the third member 30, the second member 20, the first member 10, and the third structure body 10C are provided in this order on the second structure body 10B. In the third sample SPL3, the number of the multiple second nonmagnetic layers 22 in the second member 20 is 11; and the number of the multiple second magnetic layers 21 is 11. The number of the multiple first nonmagnetic layers 12 in the first member 10 is 60; and the number of the multiple first magnetic layers 11 is 60. The thicknesses and materials of the second nonmagnetic layer 22, the second magnetic layer 21, the first nonmagnetic layer 12, and the first magnetic layer 11 are the same as those of the first sample SPL1. The second member thickness t20 is about 3 µm; and the first member thickness t10 is about 3 µm. Otherwise, the configuration of the third sample SPL3 is the same as the configuration of the first sample SPL1.

In the fourth sample SPL4 as well, the third member 30, the second member 20, the first member 10, and the third structure body 10C are provided in this order on the second structure body 10B. In the fourth sample SPL4, the third member 30 includes the third nonmagnetic layer 32 but does not include the third magnetic layer 31. The third member 30 is a Cu layer. The thickness of the Cu layer (the third nonmagnetic layer thickness t32) is 2 µm. Otherwise, the configuration of the fourth sample SPL4 is the same as the configuration of the third sample SPL3.

The fifth sample SPL5 does not include the first member 10, the second member 20, and the third member 30. The fifth sample SPL5 includes a Cu layer having a thickness of 5 µm.

It can be seen from FIG. 5 that substantially the same attenuation effect as the fifth sample SPL5 is obtained for the first sample SPL1 at the frequency f1 that is not less than 10 MHz and not more than 100 MHz. Compared to the fifth sample SPL5, high attenuation characteristics are obtained for the third sample SPL3 and the fourth sample SPL4.

The results of FIG. 5 illustrate characteristics when the frequency f1 is not less than 10 MHz. On the other hand, for example, the characteristics when the frequency f1 is not more than 10 MHz are as follows. At the frequency f1 of 170 kHz, the attenuation effect of the first sample SPL1 is −2.4 dBµV; the attenuation effect of the third sample SPL3 is −2.7 dBµV; and the attenuation effect of the fourth sample SPL4 is −2.2 dBµV. Conversely, the attenuation effect of the fifth sample SPL5 is −0.5 dBµV.

Thus, the first sample SPL1, the third sample SPL3, and the fourth sample SPL4 obtain a higher attenuation effect than the fifth sample SPL5 at the frequency f1 of not more than 10 MHz.

Thus, according to the embodiment, a higher attenuation effect than the fifth sample SPL5 is obtained at the frequency f1 that is not less than 100 kHz and not more than 100 MHz. According to the embodiment, attenuation characteristics that are equal to or greater than those of the fifth sample SPL5 also are obtained at the frequency f1 that is not less than 100 MHz.

According to the embodiment, an electromagnetic wave attenuator and an electronic device can be provided in which the attenuation characteristics for electromagnetic waves can be improved.

According to the embodiment, the first magnetic layer thickness t11 is, for example, not less than 80 nm and not more than 400 nm. The second magnetic layer thickness t21 is, for example, not less than 10 nm but less than 80 nm. When the first magnetic layer thickness t11 is not less than 80 nm and not more than 400 nm, high crystallinity of the first magnetic layer 11 is easily obtained. Because the second magnetic layer thickness t21 is not less than 10 nm but less than 80 nm, for example, the crystallinity of the second magnetic layer 21 easily becomes low.

For example, the first magnetic layer thickness t11 is not less than 4 times the second magnetic layer thickness t21. Due to such a thickness difference, a crystallinity difference easily occurs between the first magnetic layer thickness t11 and the second magnetic layer thickness t21.

According to the embodiment, for example, it is favorable for the number of the multiple first magnetic layers 11 included in the first member 10 to be less than the number of the multiple second magnetic layers 21 included in the second member 20. Because the first magnetic layer 11 is thicker than the second magnetic layer 21, the thickness of the entire electromagnetic wave attenuator is easily maintained to be thin by setting the number of the multiple first magnetic layers 11 to be small.

According to the embodiment, for example, it is favorable for the first magnetic layer thickness t11 to be not less than ½ of the first nonmagnetic layer thickness t12 along the first direction (the Z-axis direction) of the first nonmagnetic layer 12. For example, high attenuation characteristics are easily obtained thereby. For example, it is favorable for the second magnetic layer thickness t21 to be not less than ½ of the second nonmagnetic layer thickness t22 along the first direction of the second nonmagnetic layer 22. For example, high attenuation characteristics are easily obtained thereby.

The first nonmagnetic layer thickness t12 is, for example, not more than 10 nm. The second nonmagnetic layer thickness t22 is, for example, not more than 10 nm. By setting these thicknesses to be thin, for example, the thickness of the entire electromagnetic wave attenuator is easily maintained to be thin.

At least one of the first nonmagnetic layer 12 or the second nonmagnetic layer 22 includes, for example, at least one selected from the group consisting of Ta, Cr, and Ti. By the second nonmagnetic layer 22 including these materials, for example, low crystallinity of the second magnetic layer 21 is easily obtained. It is favorable for the second nonmagnetic layer 22 to include the same material as the first nonmagnetic layer 12. Thereby, for example, the manufacturing processes are simple, and a high production efficiency is easily obtained.

According to the embodiment, it is favorable for the third nonmagnetic layer 32 to include Cu. A low electrical resistivity is easily obtained thereby, and high attenuation characteristics in a high frequency domain are easily obtained. The third nonmagnetic layer 32 has a lower electrical resistivity than the first nonmagnetic layer 12 and the second nonmagnetic layer 22, and high attenuation characteristics in a high frequency domain are easily obtained.

According to the embodiment, at least one of the first magnetic layer 11 or the second magnetic layer 21 includes a soft magnetic material. For example, at least one of the first magnetic layer 11 or the second magnetic layer 21 includes Ni and Fe. At least one of the first magnetic layer 11 or the second magnetic layer 21 includes, for example, Ni, Fe, Cu, and Mo. In this material that includes Ni, Fe, Cu, and Mo, the Ni composition ratio is, for example, not less than 75 atomic % and not more than 80 atomic %; the Cu composition ratio is, for example, not less than 1 atomic % and not more than 6 atomic %; the Mo composition ratio is not less than 3 atomic % and not more than atomic %; and the Fe composition ratio is the remainder.

It is favorable for the composition of the first magnetic layer 11 to be substantially the same as the composition of the second magnetic layer 21. Thereby, for example, the manufacturing processes are simple, and a high production efficiency is easily obtained.

For example, the first magnetic layer 11 and the second magnetic layer 21 include Ni, Fe, Cu, and Mo. The Ni composition ratio in the first magnetic layer 11 is not less than 0.9 times and not more than 1.1 times the Ni composition ratio in the second magnetic layer 21. For example, the Fe composition ratio in the first magnetic layer 11 is not less than 0.9 times and not more than 1.1 times the Fe composition ratio in the second magnetic layer 21.

The third member 30 may include the third nonmagnetic layer 32 without including the third magnetic layer 31. Or, as in the first embodiment, the third member 30 may include the third magnetic layer 31 in addition to the third nonmagnetic layer 32 (e.g., the Cu layer). In such a case, the direction from the third magnetic layer 31 toward the third nonmagnetic layer 32 is along the first direction (the Z-axis direction) (referring to FIG. 1D). The third magnetic layer thickness t31 along the first direction of the third magnetic layer 31 may be equal to the third nonmagnetic layer thickness t32 along the first direction of the third nonmagnetic layer 32. For example, the third magnetic layer thickness t31 may be not less than 0.75 times and not more than 1.25 times the third nonmagnetic layer thickness t32.

In the electronic device (e.g., the semiconductor device), it is desirable to suppress the effect of electromagnetic waves. For example, the electromagnetic wave attenuator is provided in the electronic device. It is desirable for the electromagnetic wave attenuator to attenuate electromagnetic waves in the high frequency band and electromagnetic waves in the low frequency band. It is desirable for the electromagnetic wave attenuator to be thin. For example, it is easier to downsize the electronic device when the electromagnetic wave attenuator is thin. The productivity of the electromagnetic wave attenuator increases when the electromagnetic wave attenuator is thin. For example, the material cost can be reduced, and the cost can be reduced. For example, the film formation time can be shortened.

For example, high characteristics for electromagnetic waves are desirable in the high frequency band that is not less than 10 MHz and the low frequency band that is not less than 100 kHz but less than 10 MHz. Electromagnetic waves in the low frequency band are absorbed and attenuated by a magnetic layer. Therefore, for example, it is considered that attenuation characteristics in the low frequency band can be increased by setting the magnetic layer included in the electromagnetic wave attenuator to be thick (a thickness of 10 μm to 50 μm, etc.). However, when using such a method, it is difficult to downsize the electronic device.

According to the embodiment, for example, the first member 10, the second member 20, and the third member 30 are provided. For example, the third member 30 attenuates electromagnetic wave noise (high frequency noise) in the high frequency band. For example, the first member 10 and the second member 20 attenuate electromagnetic wave noise (low frequency noise) in the low frequency band. Two types of members are provided as a layer that attenuates low frequency noise. For example, the attenuation characteristics of low frequency noise can be increased thereby.

According to the embodiment, an electromagnetic wave attenuator can be provided in which electromagnetic waves in the high frequency band and the low frequency band are effectively attenuated. Thereby, high attenuation characteristics are obtained particularly in the low frequency band while maintaining a thin thickness (e.g., not more than 10 μm).

Second Embodiment

FIGS. 6 to 10 are schematic views illustrating a film formation apparatus according to a second embodiment.

Figure 6:
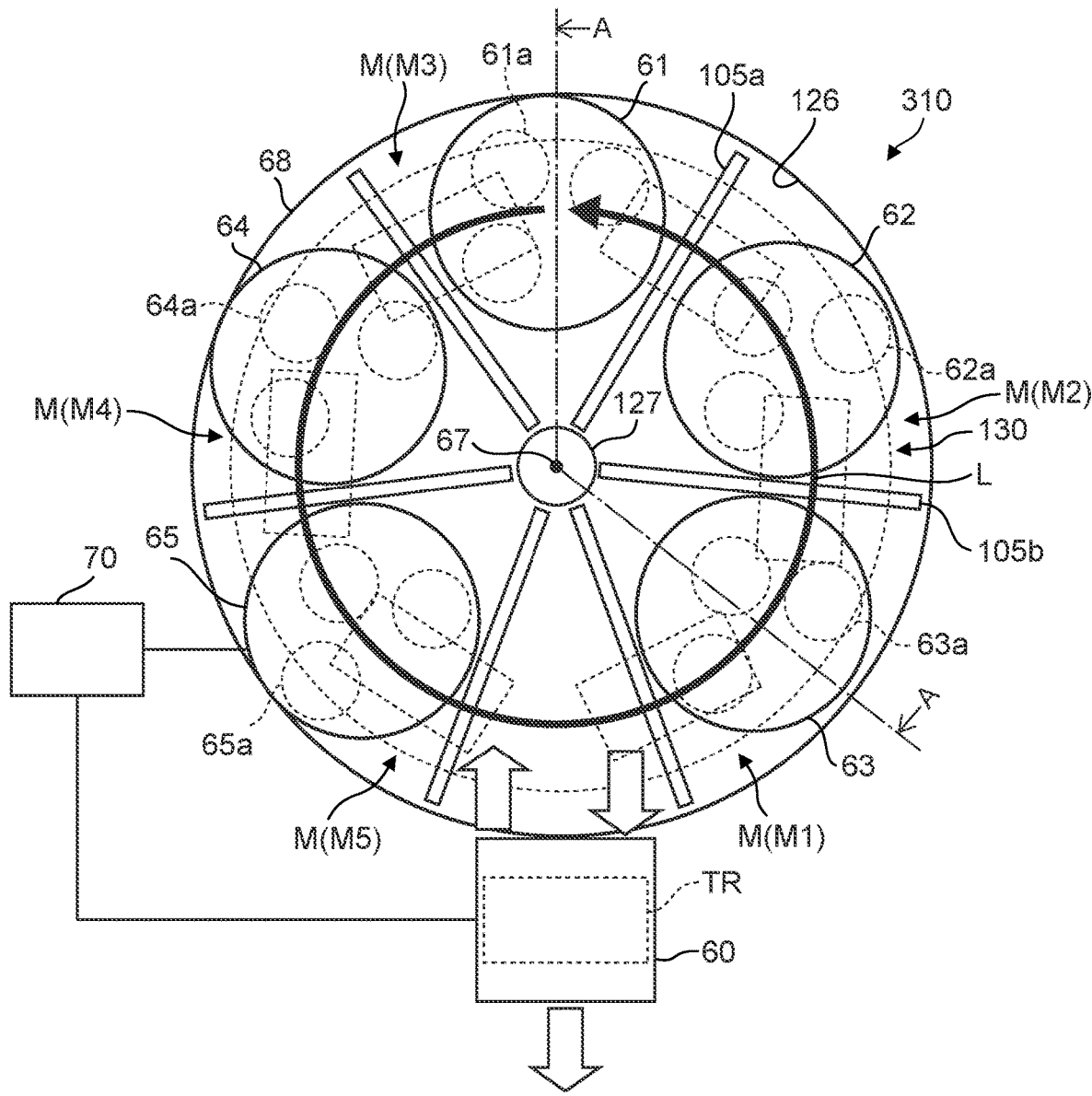
FIG. 6 is a schematic view illustrating a film formation apparatus according to a second embodiment.
Figure 7:
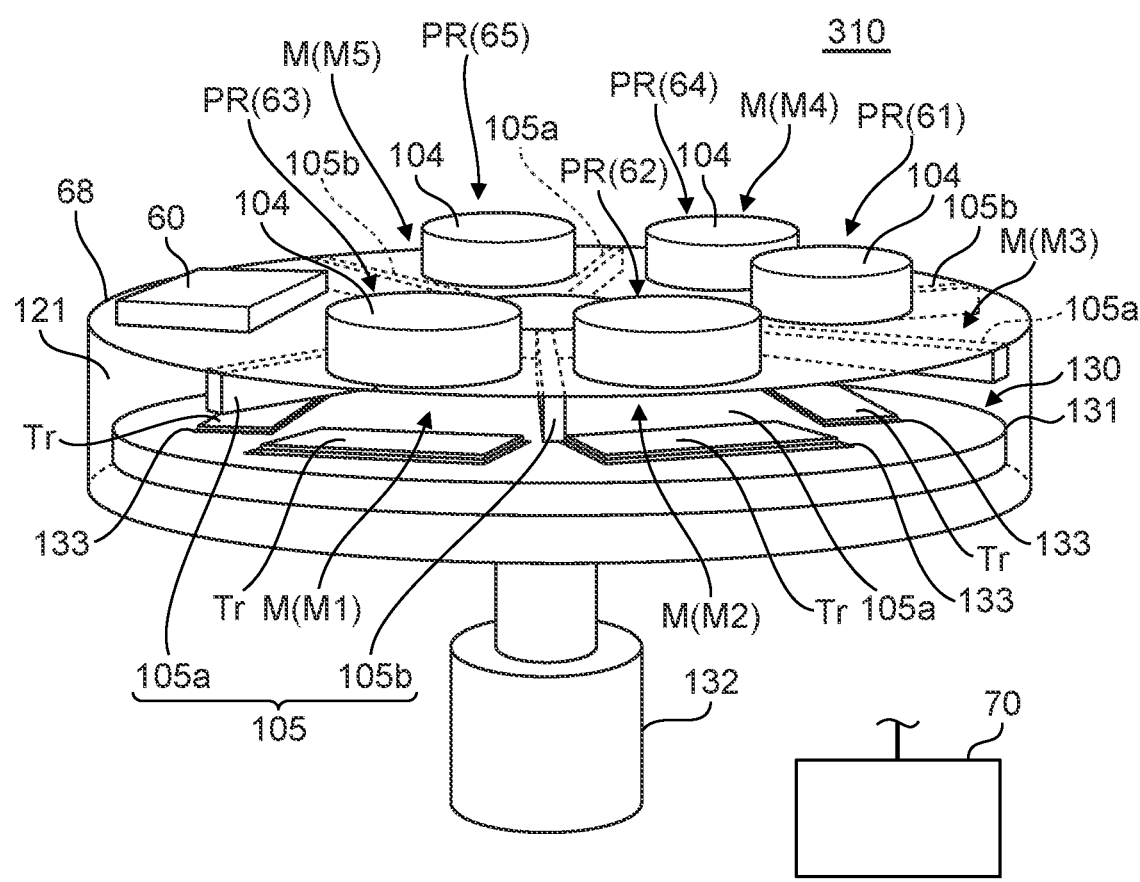
FIG. 7 is a schematic view illustrating the film formation apparatus according to the second embodiment.
Figure 8:
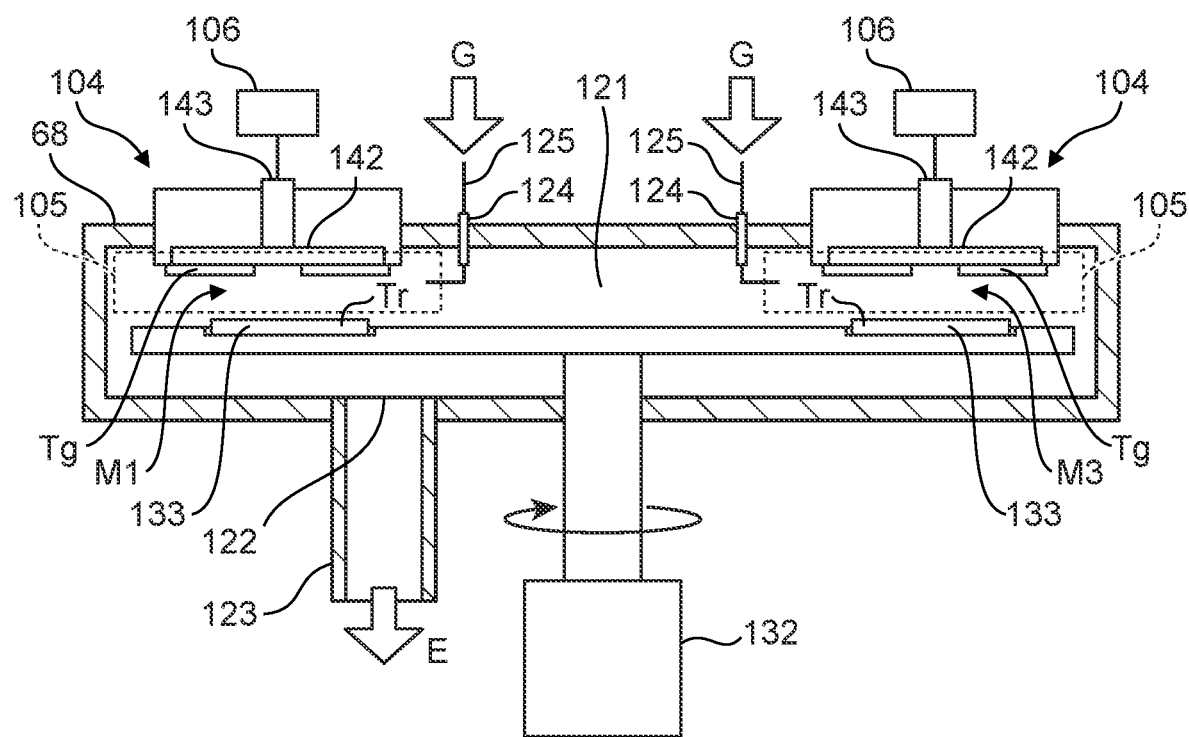
FIG. 8 is an A-A longitudinal cross-sectional view of FIG. 6 illustrating the film formation apparatus according to the second embodiment.
Figure 9:
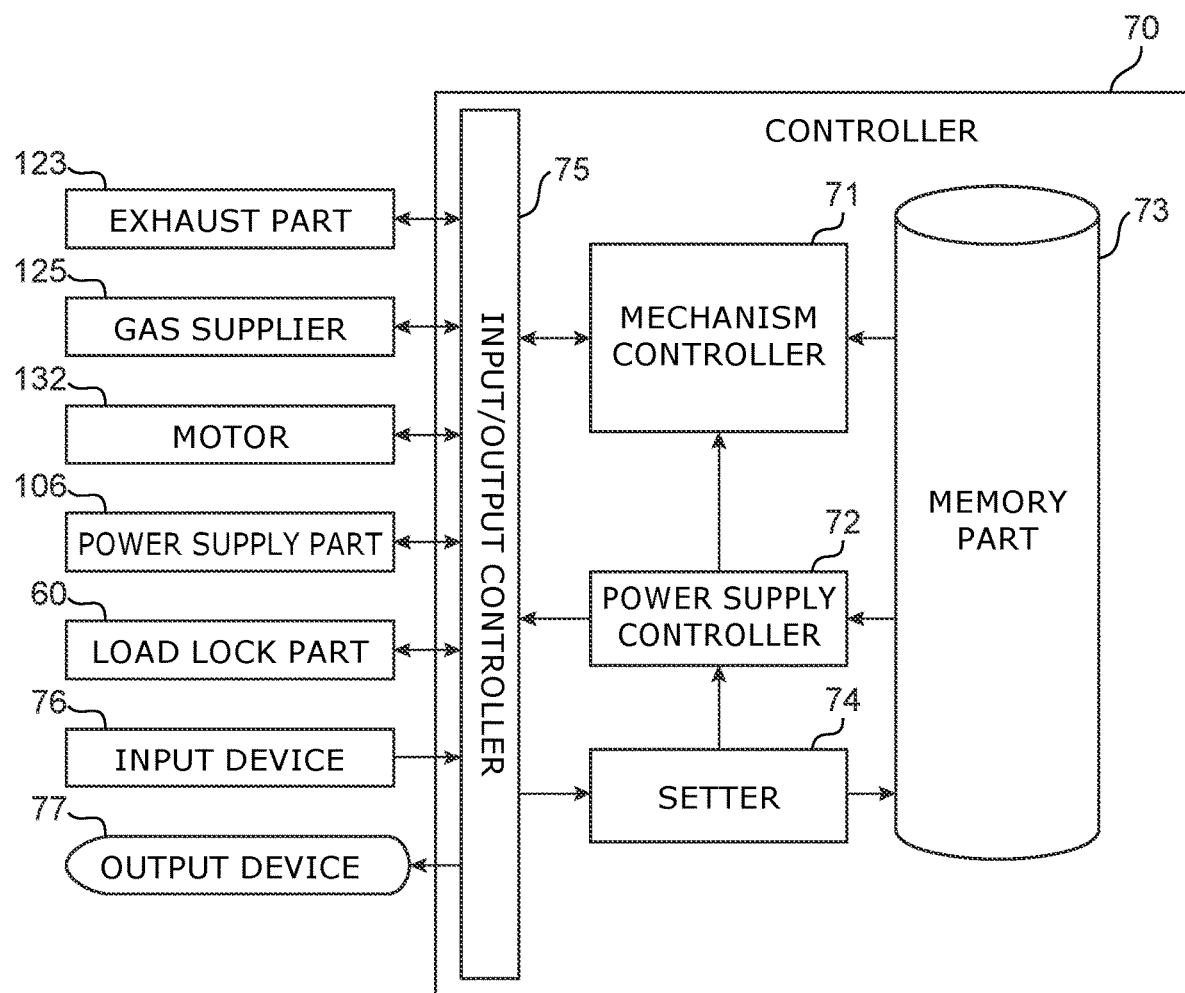
FIG. 9 is a block diagram illustrating a control device of the film formation apparatus according to the second embodiment.
Figure 10:
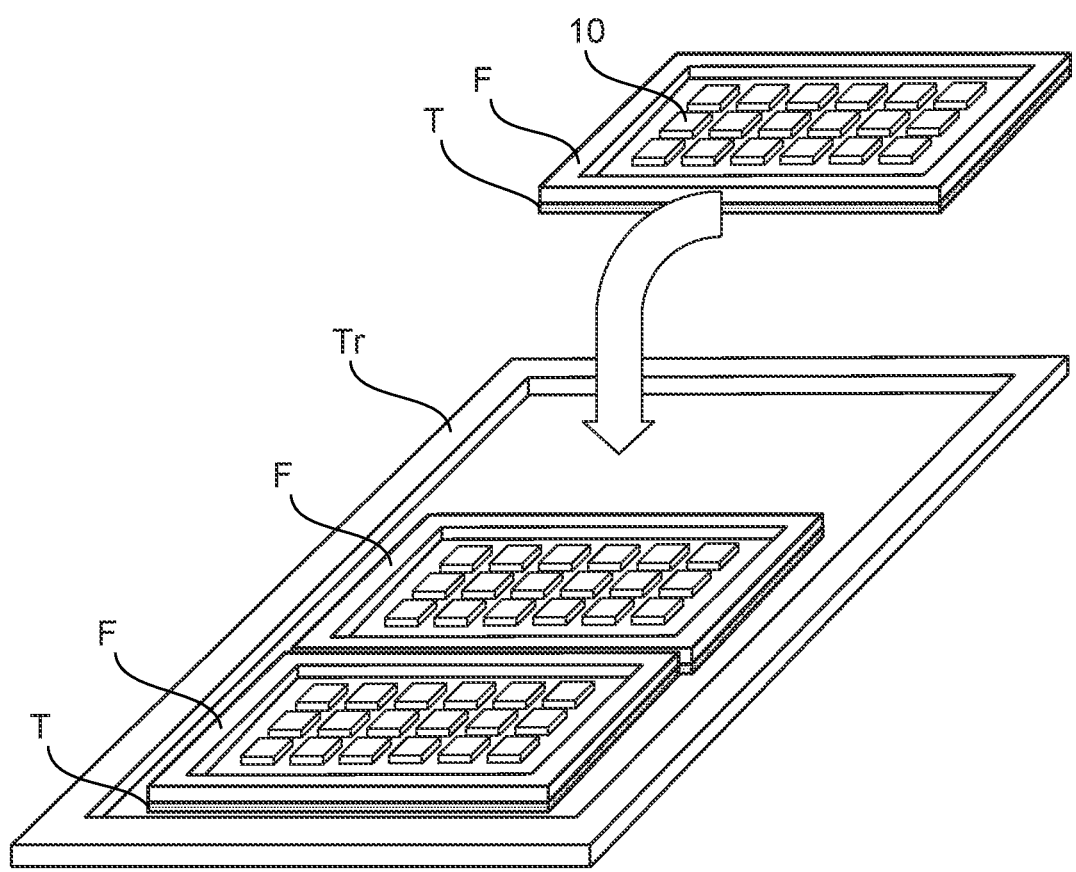
FIG. 10 is a perspective view illustrating a tray on which the electronic device is arranged in the film formation apparatus according to the second embodiment.

FIG. 6 is a plan view. FIG. 7 is a perspective view. FIG. 8 is an A-A longitudinal cross-sectional view of FIG. 6. FIG. 9 is a block diagram. FIG. 10 is a perspective view. As shown in FIG. 6, the film formation apparatus 310 according to the embodiment includes a container 68, a transfer part 130, a first film formation part 61, a second film formation part 62, a third film formation part 63, a load lock part 60, and a controller 70. In the example, the film formation apparatus 310 includes a fourth film formation part 64 and a fifth film formation part 65.

The film formation apparatus 310 forms the electromagnetic wave attenuator 110 by sputtering on the outer surface of the package 42 of the individual electronic devices 210. In the film formation apparatus 310 according to the embodiment as shown in FIG. 7, the electronic device 210 that is on a tray Tr held by a holder 133 moves in a circumferential trajectory when a rotating table 131 is rotated. In the film formation apparatus 310 according to the embodiment, film formation is performed by adhering, to the electronic device 210, particles sputtered from the target of a sputter source 104 when the electronic device 210 passes through a position facing the sputter source 104.

The container 68 is configured to maintain the interior of the container 68 is a state that is depressurized from atmospheric pressure.

As shown in FIG. 8, the container 68 is a container into which a sputtering gas G is introduced. The sputtering gas G is for sputtering onto the package 42 of the electronic device 210 by causing ions and the like generated by plasma generated by the application of electrical power to collide with a target Tg. For example, an inert gas such as argon gas, etc., can be used as the sputtering gas G.

The space inside the container 68 forms a vacuum chamber 121. The vacuum chamber 121 is airtight. The vacuum chamber 121 is a space that can be set to a vacuum by depressurization. For example, as shown in FIGS. 7 and 8, the vacuum chamber 121 is a circular columnar sealed space.

The container 68 includes an exhaust port 122 and an inlet 124. The exhaust port 122 is an opening for exhaust E and ensures the flow of gases between the vacuum chamber 121 and the outside. For example, the exhaust port 122 is formed in the bottom portion of the container 68. An exhaust part 123 is connected to the exhaust port 122. The exhaust part 123 includes piping, a not-illustrated pump, valves, etc. The vacuum chamber 121 interior is depressurized by the exhausting by the exhaust part 123.

The inlet 124 is an opening for introducing the sputtering gas G to the vacuum chamber 121 at the vicinity of the target Tg. A gas supplier 125 is connected to the inlet 124. One gas supplier 125 is provided for each target Tg. The gas supplier 125 includes piping as well as a not-illustrated gas supply source of the sputtering gas G, a pump, valves, etc. The sputtering gas G is introduced to the vacuum chamber 121 through the inlet 124 by the gas supplier 125.

Returning now to FIG. 6, the first to fifth film formation parts 61 to 65 and the transfer part 130 are located in the container 68. The controller 70 controls the first to fifth film formation parts 61 to 65, the transfer part 130, and the load lock part 60.

The transfer part 130 is located in the container 68. The transfer part 130 is a device that circulatively transfers the electronic device 210 in a circumferential trajectory. The trajectory in which the electronic device 210 is moved by the transfer part 130 such as that described above is called a transfer path L. Circulative transfer refers to repeating the circling movement of the electronic device 210 along a circumferential trajectory. The transfer part 130 includes the rotating table 131, a motor 132, and the holder 133.

The rotating table 131 is a circular plate. The motor 132 is a drive source that applies a drive force to the rotating table 131 and rotates the rotating table 131 with the center of the circle as the axis. The holder 133 is a component that holds the trays Tr transferred by the transfer part 130. That is, the electronic device 210 is held by the holder 133 via the tray Tr. As shown in FIG. 10, multiple electronic devices 210 are orderly arranged at intervals on a tape T stretched in the horizontal direction in a frame F that is a substantially rectangular frame body. Thereby, a film is formed on the top surface 42*a* and the side surface 42*b*. Only the upper surface of the tape T is adhesive; and the electronic devices 210 are adhered to the upper surface. Thus, multiple frames F are prepared in which the electronic devices 210 are disposed. The frames F are loaded on the tray Tr that is a substantially rectangular flat plate having a protruding rim portion at the periphery. However, the electronic device 210 may be singly held by the holder 133. Thus, the electronic devices 210 are positioned on the rotating table 131 by the holder 133.

The multiple holders 133 are arranged at uniform spacing. For example, the holders 133 are arranged along an orientation parallel to a tangent of a circle in the circumferential direction of the rotating table 131, and are arranged at uniform spacing in the circumferential direction. More specifically, the holder 133 is a groove, hole, protrusion, jig, holder, or the like that holds the tray Tr or the electronic device 210. The holder 133 also can be configured by combining an electrostatic chuck, a mechanical chuck, or an adhesive chuck, or by combining a chuck with a groove, hole, protrusion, jig, holder, tray, etc. According to the embodiment, six holders 133 are provided. Therefore, six trays Tr or electronic devices 210 are held at a spacing of 60° on the rotating table 131. However, one or multiple holders 133 may be used.

The first to fifth film formation parts 61 to 65 form a nonmagnetic layer (a nonmagnetic film) or a magnetic layer (a magnetic film) on the processing body transferred by the transfer part 130.

Hereinbelow, the multiple film formation parts (the first to fifth film formation parts 61 to 65, etc.) are described as a film formation part PR when not differentiating (referring to FIG. 7). As shown in FIG. 8, the film formation part PR includes the sputter source 104, a partition part 105, and a power supply part 106. Hereinbelow, the processing body is described as the electronic device 210 in a state before the electromagnetic wave attenuator 110 is formed.

The sputter source 104 is a supply source of a film formation material that is formed as a film on the electronic device 210 by depositing the film formation material by sputtering. The sputter source 104 includes the target Tg, a backing plate 142, and an electrode 143. The target Tg is formed of a film formation material that becomes a film by being deposited on the electronic device 210. The target Tg is located at a position that faces the transfer path L and is separated from the transfer path L. As the target Tg according to the embodiment, three targets (three of each of first to fifth targets 61*a* to 65*a*) are provided in each of the multiple film formation parts as shown in FIG. 6. However, one, two, four, or more targets may be used. Hereinbelow, the target Tg is referred to when not differentiating between the targets Tg (61*a*, 62*a*, 63*a*, 64*a*, and 65*a*). The bottom surface side of the target Tg is separated from and faces the electronic device 210 that is moved by the transfer part 130. The target Tg is, for example, circular columnar. The target Tg may be oval columnar, prism-shaped, etc., or may have another shape.

The backing plate 142 is a member that holds the target Tg. The electrode 143 is a conductive member for applying electrical power to the target Tg from outside the container 68. A magnet, a cooling mechanism, etc., may be provided as necessary or as appropriate in the sputter source 104.

As shown in FIG. 8, a plurality of such sputter sources 104 is arranged along the circumferential direction at the upper lid of the container 68. Five sputter sources 104 are provided in the example of FIGS. 7, 5, and 8.

Examples of the targets Tg of the first to fifth film formation parts 61 to 65 will now be described.

The first film formation part 61 includes the first target 61*a*. The second film formation part 62 includes the second target 62*a*. The first target 61*a* and the second target 62*a* include a material used to form the first and second magnetic layers 11 and 21 of the first structure body 10A, and includes a magnetic substance. For example, the first target 61*a* and the second target 62*a* include Ni, Fe, Cu, and Mo. In one example, the composition ratios of the first target 61*a* may be substantially equal to the composition ratios of the second target 62*a*.

The third film formation part 63 includes the third target 63*a*. The third target 63*a* includes a material used to form the first and second nonmagnetic layers 12 and 22 of the first structure body 10A. The third target 63*a* includes, for example, a nonmagnetic substance. In one example, the third target 63*a* includes Ta.

The fourth film formation part 64 includes the fourth target 64*a*. The fourth target 64*a* includes a material used to form the third nonmagnetic layer 32 of the first structure body 10A. The fourth target 64*a* includes, for example, a nonmagnetic substance. In one example, the fourth target 64*a* includes Cu.

The fifth film formation part 65 includes the fifth target 65*a*. The fifth target 65*a* includes, for example, a nonmagnetic substance. In one example, the fifth target 65*a* includes a material (e.g., stainless steel) used to form the second structure body 10B and the third structure body 10C.

The partition part 105 is a member that partitions film formation positions M1 to M5 at which films are formed on the electronic device 210 by the sputter sources 104. Hereinbelow, the film formation position M is referred to when not differentiating between the multiple film formation positions M1 to M5 (referring to FIG. 7). As shown in FIG. 7, the partition part 105 includes rectangular wall plates 105*a* and 105*b*. The wall plates 105*a* and 105*b* are arranged radially from the center of the circumference of the transfer path L. For example, the wall plates 105*a* and 105*b* are arranged radially from a rotation central axis 67 of the rotating table 131 of the transfer part 130 (referring to FIG. 6). For example, the wall plates 105*a* and 105*b* are located at positions at the ceiling of the vacuum chamber 121 so that the target Tg is interposed. The lower end of the partition part 105 faces the rotating table and is separated from the rotating table by a gap through which the electronic device 210 passes through. The diffusion into the vacuum chamber 121 of the sputtering gas G and the film formation material can be suppressed by the partition part 105.

The film formation position M is a space that includes the target Tg of the sputter source 104 and is partitioned by the partition part 105. More specifically, as shown in FIG. 6, the film formation position M is a space that is surrounded in a fan-like shape when viewed along the planar direction by the wall plates 105*a* and 105*b* of the partition part 105, an inner surface 126 of the outer perimeter wall of the container 68, and an outer surface 127 of the inner perimeter wall of the container 68. The area in the horizontal direction of the film formation position M is the region partitioned by the pair of wall plates 105*a* and 105*b*.

The film formation material is deposited as a film on the electronic device 210 passing through the position of the film formation position M facing the target Tg. The film formation position M is, for example, the region where the majority of the film formation is performed. There is leakage of the film formation material from the film formation position M at regions outside the film formation position M. Therefore, a portion of the deposition of the film also may be performed in a region outside the film formation position M.

The power supply part 106 is a component that applies electrical power to the target Tg. The sputtering gas G can be plasmatized and the film formation material can be deposited on the electronic device 210 by the power supply part 106 applying the electrical power to the target Tg. According to the embodiment, the power supply part 106 is, for example, a DC power supply that applies a high voltage. In the case of an apparatus that performs high frequency sputtering, the power supply part 106 can be an RF power supply. The rotating table 131 has the same potential as the container 68 that is grounded. A potential difference is generated between the rotating table 131 and the target Tg side by applying a high voltage to the target Tg side.

The multiple film formation parts PR form films including layers of multiple types of film formation materials by selectively depositing film formation materials. In particular, according to the embodiment, films that include layers of multiple types of film formation materials are formed by providing the sputter sources 104 that correspond to different types of film formation materials and by selectively depositing the film formation materials. The state in which the sputter sources 104 correspond to different types of film formation materials includes the case where a portion of the multiple film formation parts PR among all of the film formation parts PR includes a common film formation material, and the remaining other film formation parts PR include film formation materials different from the common film formation material. According to the embodiment, a magnetic substance is included in the film formation material common to the multiple film formation parts PR. Selectively depositing the film formation material one type at a time refers to the film formation part PR of another film formation material not performing film formation while the film formation part PR of one type of film formation material is performing film formation. Film formation being performed at the film formation part PR or the film formation position refers to the film formation part PR or the film formation position M being in a state in which electrical power is applied to the target Tg of the film formation part PR and film formation is being performed on the electronic device 210.

According to the embodiment, five film formation parts (the first to fifth film formation parts 61 to 65) are provided along the transfer direction of the transfer path L. The film formation positions M1 to M5 correspond to the five film formation parts (the first to fifth film formation parts 61 to 65).

At least a portion of the electromagnetic wave attenuator 110 described in reference to the first embodiment is formed by such a film formation apparatus 310. For example, at least a portion of the first structure body 10A is formed by the film formation apparatus 310. The first structure body 10A includes the first member 10 and the second member 20. As described above, the first member 10 includes the multiple first magnetic layers 11 and the multiple first nonmagnetic layers 12. One of the multiple first nonmagnetic layers 12 is between the multiple first magnetic layers 11. The second member 20 includes the multiple second magnetic layers 21 and the multiple second nonmagnetic layers 22. One of the multiple second nonmagnetic layers 22 is between the multiple second magnetic layers 21. The thickness of one of the multiple first magnetic layers 11 is greater than the thickness of one of the multiple second magnetic layers 21.

The first structure body 10A that is formed by the film formation apparatus 310 may include the third member 30. The third member 30 may include, for example, the multiple third magnetic layers 31 and the third nonmagnetic layer 32.

The first magnetic layer 11 and the second magnetic layer 21 are formed by at least one of the first film formation part 61 or the second film formation part 62. The first nonmagnetic layer 12 and the second nonmagnetic layer 22 are formed by the third film formation part 63.

For example, the third nonmagnetic layer 32 is formed by the fourth film formation part 64. The third magnetic layer 31 may be formed by at least one of the first film formation part 61 or the second film formation part 62.

The material that is used to form the second structure body 10B and the third structure body 10C is formed by the fifth film formation part 65.

The load lock part 60 is a device that transfers, from the outside into the vacuum chamber 121, the unprocessed electronic device 210 or the tray Tr on which the unprocessed electronic device 210 is loaded and transfers the processed electronic device 210 or tray Tr out of the vacuum chamber 121 by not-illustrated transfer means in a state in which the vacuum of the vacuum chamber 121 is maintained. A well-known structure is applicable to the load lock part 60, and a description is therefore omitted.

The controller 70 controls the operations of the film formation parts described above. The control of the operations also includes the control of the movement of the processing bodies.

The controller 70 is a device that controls the components of the film formation apparatus 310. The controller 70 can include, for example, a dedicated electronic circuit, a computer operated by a prescribed program, etc. That is, for example, the controller 70 is programmed with control content relating to the control relating to the introduction and the exhaust of the sputtering gas G into and out of the vacuum chamber 121, the control of the power supply of the sputter source 104, the control of the rotation of the rotating table 131, etc. The control that is performed by the controller 70 is executed by a processing device such as a PLC (Programmable Logic Controller), a CPU (Central Processing Unit), etc. The control that is performed by the controller 70 is adaptable to a wide variety of film formation specifications.

The control content includes, for example, the initial exhaust pressure of the film formation apparatus 310, the selection of the sputter source 104, the electrical power applied to the target Tg, the flow rate, type, introduction time, pump-down time, and film formation time of the sputtering gas G, etc.

An example of the configuration of the controller 70 for executing the operations of the components as described above will now be described with reference to FIG. 9. For example, FIG. 9 is a virtual functional block diagram. The controller 70 includes, for example, a mechanism controller 71, a power supply controller 72, a memory part 73, a setter 74, and an input/output controller 75.

The mechanism controller 71 is a processor that controls controlled parts such as drive sources, valves, switches, power supplies, etc. For example, the controlled parts are included in the exhaust part 123, the gas supplier 125, the motor 132 of the transfer part 130, the load lock part 60, etc.

For example, the controller 70 selectively controls the film formation parts PR so that the film formation parts PR of other film formation materials do not perform film formation while the film formation part PR of one type of film formation material is performing film formation.

The memory part 73 is a component that stores information necessary for the control according to the embodiment.

The setter 74 is a processor that sets information input from the outside in the memory part 73. The input/output controller 75 is an interface that controls the input and output and/or conversion of signals between the components to be controlled.

An input device 76 and the output device 77 are connected to the controller 70. The input device 76 is an inputter for an operator to operate the film formation apparatus 310 via the controller 70. The inputter includes a switch, a touch panel, a keyboard, a mouse, etc. For example, the selection of the sputter source 104 to perform the film formation can be input by the inputter.

The output device 77 is an outputter that provides visibly recognizable information for an operator to check the state of the apparatus. The outputter includes, for example, a display, a lamp, a meter, etc. For example, the output device 77 can display the film formation position M corresponding to the sputter source 104 performing film formation so that the film formation position M can be differentiated from the other film formation positions M.

An example of the film formation by the film formation apparatus 310 will now be described. For example, the following operations are performed by a control of the controller 70. In the following example, the first sample SPL1 described above is formed.

Figure 11:
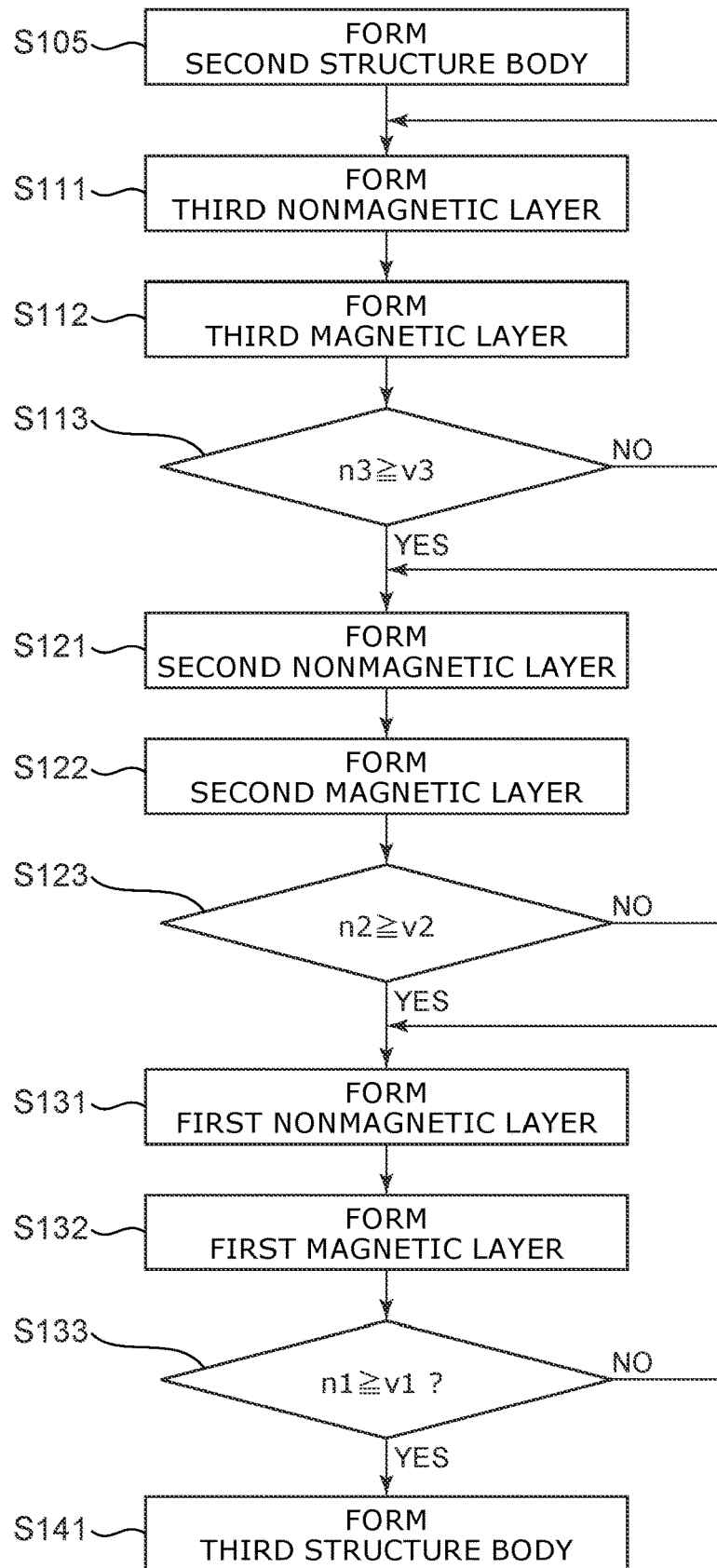
FIG. 11 is a flowchart illustrating operations of the film formation apparatus according to the second embodiment.

FIG. 11 is a flowchart illustrating operations of the film formation apparatus according to the second embodiment.

First, before step S105, the electronic device 210 that is the processing body is introduced to the container 68 via the load lock part 60.

The exhaust part 123 sets the vacuum chamber 121 to a vacuum by exhausting and depressurizing. The gas supplier 125 of the film formation part PR supplies the sputtering gas G around the target Tg. The rotating table 131 rotates and reaches a prescribed rotational speed. Thereby, the electronic device 210 that is held by the holder 133 moves in a circular trajectory on the transfer path L and passes through a position facing the sputter source 104.

The second structure body 10B is formed as shown in FIG. 11 (step S105). For example, film formation of a layer of stainless steel is performed by the fifth film formation part 65.

The specific operation of step S105 is as follows. The power supply part 106 of only the fifth film formation part 65 applies electrical power to the target Tg of the fifth film formation part 65. The sputtering gas G is plasmatized thereby. In the sputter source 104, ions that are generated by the plasma collide with the target Tg and eject particles of the film formation material. Therefore, a film is formed on the surface of the electronic device 210 passing through the film formation position M5 of the fifth film formation part 65 by the particles of the film formation material being deposited each time the electronic device 210 passes through. Here, a layer of stainless steel is formed. At this time, the electronic device 210 passes through the film formation positions M1 to M4 of the first to fourth film formation parts 61 to 64. The electronic device 210 is heated in the film formation position in which film formation is performed by the radiant heat of the plasma generated by applying the electrical power to the target. Electrical power is not applied to the targets Tg of the first to fourth film formation parts 61 to 64; therefore, film formation is not performed and the electronic device 210 is not heated in the film formation positions M1 to M4. The electronic device 210 is not heated in the regions other than the film formation positions M1 to M4 as well. The electronic device 210 emits heat in such regions in which heating is not performed. The fifth film formation part 65 is stopped when the film formation time of the film formation part PR has elapsed. That is, the application of the electrical power to the target Tg by the power supply part 106 is stopped.

As shown in FIG. 11, the formation of the third nonmagnetic layer 32 (step S111) and the formation of the third magnetic layer 31 (step S112) are performed. At least a portion of the third nonmagnetic layer 32 (e.g., the Cu layer) is formed by the fourth film formation part 64. At least a portion of the third magnetic layer 31 (e.g., the NiFeCuMo layer) is formed by at least one of the first film formation part 61 or the second film formation part 62.

The specific operation of step S111 is as follows. The power supply part 106 of the fourth film formation part 64 applies electrical power to the target Tg of the fourth film formation part 64. The sputtering gas G is plasmatized thereby. In the sputter source 104, ions that are generated by the plasma collide with the target Tg and eject particles of the film formation material. Therefore, a film is formed on the surface of the electronic device 210 passing through the film formation position M4 of the fourth film formation part 64 by the particles of the film formation material being deposited each time the electronic device 210 passes through. Here, a Cu layer that is used to form the third nonmagnetic layer 32 is formed. At this time, the electronic device 210 passes through the film formation positions M1 to M3 and M5 of the first to third and fifth film formation parts 61 to 63 and 65. Electrical power is not applied to the targets Tg of the first to third and fifth film formation parts 61 to 63 and 65; therefore, film formation is not performed and the electronic device 210 is not heated in the film formation positions M1 to 3 and M5. The electronic device 210 is not heated in the regions other than the film formation position M4 as well. The electronic device 210 emits heat in such regions in which heating is not performed. The fourth film formation part 64 is stopped when the film formation time of the fourth film formation part 64 has elapsed. That is, the application of the electrical power to the target Tg by the power supply part 106 is stopped.

Then, in step S112, the power supply part 106 of the first film formation part 61 applies electrical power to the target Tg of the first film formation part 61. Thereby, the sputtering gas G is plasmatized in the film formation position M1. In the sputter source 104, ions that are generated by the plasma collide with the target Tg and eject particles of the film formation material. Therefore, a film is formed on the surface of the electronic device 210 passing through the film formation position M1 by the particles of the film formation material being deposited each time the electronic device 210 passes through. Here, a NiFeCuMo layer that is used to form the third magnetic layer 31 is formed. At this time, the electronic device 210 passes through the film formation positions M2 to M5 of the second to fifth film formation parts 62 to 65. Electrical power is not applied to the targets Tg in the second to fifth film formation parts 62 to 65; therefore, film formation is not performed, and the electronic device 210 is not heated. The electronic device 210 is not heated in the regions other than the film formation position M1 as well. The electronic device 210 emits heat in such regions in which heating is not performed.

The first film formation part 61 is stopped when the film formation time of the first film formation part 61 has elapsed. That is, the application of the electrical power to the target Tg by the power supply part 106 is stopped.

Subsequently, a Cu layer that is used to form another third nonmagnetic layer 32 is formed on the formed third magnetic layer 31 by re-performing film formation by the fourth film formation part 64. Such a formation of the Cu layer and formation of the NiFeCuMo layer are alternately performed.

Thus, the third member 30 is formed by stacking many third nonmagnetic layers 32 (Cu layers) and third magnetic layers 31 (NiFeCuMo layers) by repeating the film formation by the fourth film formation part 64 and the film formation by the first film formation part 61.

A number n3 of formations of one of the third nonmagnetic layer 32 or the third magnetic layer 31 is compared to a determined value v3 (step S113). When the number n3 is less than the value v3, the flow returns to step S111. In the first sample SPL1, the value v3 is 10. When the number n3 is not less than the value v3, the flow proceeds to the following step S121. For example, the "number of formations" can be determined from the number of applications or the application time of the electrical power to the target Tg.

As shown in FIG. 11, the formation of the second nonmagnetic layer 22 (step S121) and the formation of the second magnetic layer 21 (step S122) are performed. At least a portion of the second nonmagnetic layer 22 (e.g., the Ta layer) is formed by the third film formation part 63. At least a portion of the second magnetic layer 21 (e.g., the NiFeCuMo layer) is formed by at least one of the first film formation part 61 or the second film formation part 62.

The specific operation of step S121 is as follows. The power supply part 106 of the third film formation part 63 applies electrical power to the target Tg of the third film formation part 63. The sputtering gas G is plasmatized thereby. In the sputter source 104, ions that are generated by the plasma collide with the target Tg and eject particles of the film formation material. Therefore, a film is formed on the surface of the electronic device 210 passing through the film formation position M3 of the third film formation part 63 by the particles of the film formation material being deposited each time the electronic device 210 passes through. Here, a Ta layer that is used to form the second nonmagnetic layer 22 is formed. At this time, the electronic device 210 passes through the film formation positions M1, M2, M4, and M5 of the first, second, fourth, and fifth film formation parts 61, 62, 64, and 65. In these film formation parts, electrical power is not applied to the target Tg; therefore, film formation is not performed, and the electronic device 210 is not heated. The electronic device 210 is not heated in the regions other than the film formation position M3 as well. The electronic device 210 emits heat in such regions in which heating is not performed.

The third film formation part 63 is stopped when the film formation time of the third film formation part 63 has elapsed. That is, the application of the electrical power to the target Tg by the power supply part 106 is stopped.

Then, the power supply part 106 of at least one of the first film formation part 61 or the second film formation part 62 applies electrical power to the target Tg. The case where electrical power is applied to the first film formation part 61 will now be illustrated. The sputtering gas G in the film formation position M1 is plasmatized thereby. In the sputter source 104, ions that are generated by the plasma collide with the target Tg and eject particles of the film formation material. Therefore, a film is formed on the surface of the electronic device 210 passing through the film formation position M1 of the first film formation part 61 by the particles of the film formation material being deposited each time the electronic device 210 passes through. Here, a NiFeCuMo layer that is used to form the second magnetic layer 21 is formed. At this time, the electronic device 210 passes through the film formation positions M2 to M5 of the second to fifth film formation parts 62 to 65. Electrical power is not applied to the targets Tg of the second to fifth film formation parts 62 to 65; therefore, film formation is not performed, and the electronic device 210 is not heated. The electronic device 210 is not heated in the regions other than the film formation position M1 as well. The electronic device 210 emits heat in such regions in which heating is not performed.

The first film formation part 61 is stopped when the film formation time of the first film formation part 61 has elapsed. That is, the application of the electrical power to the target Tg by the power supply part 106 is stopped.

Subsequently, a Ta layer that is used to form another second nonmagnetic layer 22 is formed by re-performing the film formation by the third film formation part 63 on the second magnetic layer 21 that is formed. The formation of the Ta layer and the formation of the NiFeCuMo layer such as those described above are alternately performed.

Thus, the second member 20 is formed by stacking many second nonmagnetic layers 22 (Ta layers) and second magnetic layers 21 (NiFeCuMo layers) by repeating the film formation by the third and first film formation parts 63 and 61.

A number n2 of formations of one of the second nonmagnetic layer 22 or the second magnetic layer 21 is compared to a determined value v2 (step S123). When the number n2 is less than the value v2, the flow returns to step S121. In the first sample SPL1, the value v2 is 40. When the number n2 is not less than the value v2, the flow proceeds to the following step S131.

As shown in FIG. 11, the formation of the first nonmagnetic layer 12 (step S131) and the formation of the first magnetic layer 11 (step S132) are performed. At least a portion of the first nonmagnetic layer 12 (e.g., the Ta layer) is formed by the third film formation part 63. At least a portion of the first magnetic layer 11 (e.g., the NiFeCuMo layer) is formed by at least one of the first film formation part 61 or the second film formation part 62.

The specific operations of steps S131 and S132 are similar to steps S121 and S122, and a description is therefore omitted. The first structure body 10A is formed by stacking many first nonmagnetic layers 12 (Ta layers) and first magnetic layers 11 (NiFeCuMo layers) by repeating the film formation by the third film formation part 63 and the film formation by the first film formation part 61. A number n1 of formations of one of the first nonmagnetic layer 12 or the first magnetic layer 11 is compared to a determined value v1 (step S133). When the number n1 is less than the value v1, the flow returns to step S131. In the first sample SPL1, the value v1 is 7. When the number n1 is not less than the value v1, the flow proceeds to the following step S141.

As shown in FIG. 11, the formation of the third structure body 10C (step S141) is performed. For example, the formation of a layer of stainless steel is performed by the fifth film formation part 65. The specific operation of step S141 is similar to step S105.

In the film formation apparatus 310 according to the embodiment as described above, the number of film formation parts (the first film formation part 61 and the second film formation part 62) for forming the magnetic layers is greater than the number of film formation parts (the third film formation part 63) for forming the nonmagnetic layers stacked on the magnetic layers.

The thicknesses are appropriately controlled in the formation of such magnetic layers and nonmagnetic layers. As described above, the thickness of one of the multiple first magnetic layers 11 (the first magnetic layer thickness t11) is greater than the thickness of one of the multiple second magnetic layers 21 (the second magnetic layer thickness t21). For example, the controller 70 performs the following control when forming two such types of magnetic layers having different thicknesses.

The controller 70 causes the first film formation part 61 to form a portion of one of the multiple first magnetic layers 11 and subsequently causes the second film formation part 62 to form another portion of the one of the multiple first magnetic layers 11. Or, the controller 70 causes the first film formation part 61 to form one of the multiple first magnetic layers 11, and causes the second film formation part 62 to form another one of the multiple first magnetic layers 11.

The controller 70 causes the third film formation part 63 to form the multiple first nonmagnetic layers 12.

When forming a thick first magnetic layer 11 as described above, a portion of one first magnetic layer 11 may be formed by the first film formation part 61, and the remainder may be formed by the second film formation part 62. In other words, when forming one first magnetic layer 11, electrical power is applied to the targets Tg of the first and second film formation parts 61 and 62, and the electronic device 210 is caused to pass through the film formation positions M1 and M2. Thereby, one first magnetic layer 11 is formed by the first and second film formation parts 61 and 62.

Or, a portion of the multiple first magnetic layers 11 may be formed by the first film formation part 61, and the remainder of the multiple first magnetic layers 11 may be formed by the second film formation part 62. In other words, when forming one first magnetic layer 11, electrical power is applied to the target Tg (the first target 61a) of the first film formation part 61; and the electronic device 210 is caused to pass through the film formation position M1. When the formation of the one first magnetic layer 11 has ended and another first magnetic layer 11 is formed, electrical power is applied to the target Tg (the second target 62a) of the second film formation part 62; and the electronic device 210 is caused to pass through the film formation position M2. Thereby, the multiple first magnetic layers 11 are formed by one of the first film formation part 61 or the second film formation part 62.

In such a case, the controller 70 causes one of the first film formation part 61 or the second film formation part 62 to form one of the multiple second magnetic layers 21. The other of the first film formation part 61 or the second film formation part 62 forms another one of the multiple second magnetic layers 21. The third film formation part 63 is caused to form the multiple second nonmagnetic layers 22.

Thus, the operations of the first and second film formation parts 61 and 62 may be modified when forming the first magnetic layer 11 and the second magnetic layer 21 that have mutually-different thicknesses. Thereby, for example, the consumed amount of the target easily becomes uniform between the first target 61a and the second target 62a. As a result, the life of each target can be long, and the maintenance frequency for target replacement can be reduced. Also, for example, the first magnetic layer 11 and the second magnetic layer 21 that have more uniform characteristics are easily obtained. Thus, an electromagnetic wave attenuator and an electronic device in which the attenuation characteristics of the electromagnetic waves can be improved can be manufactured with higher productivity.

Since heat can be released even during the film formation, low-temperature sputtering becomes possible, and as the second magnetic layer 21, it is possible to form a layer in which crystals are difficult to grow and the crystallinity is low. The first magnetic layer 11 is thicker than the second magnetic layer 21. Therefore, the film formation time of the first magnetic layer 11 is longer than the film formation time of the second magnetic layer 21. The heating time in the first magnetic layer 11 is longer than the heating time in the second magnetic layer 21. Crystals are likely to grow in the first magnetic layer 11. Therefore, as described above in the first embodiment, the crystallinity of the first magnetic layer 11 can be made higher than that of the second magnetic layer 21.

Third Embodiment

A third embodiment relates to a film formation method. The film formation method performs the processing illustrated in FIG. 11. The film formation method according to the embodiment performs the processing of the following processes when forming the first structure body 10A described above. A portion of one of the multiple first magnetic layers 11 is formed by the first film formation part 61; subsequently, another portion of the one of the multiple first magnetic layers 11 is formed by the second film formation part 62. Or, one of the multiple first magnetic layers 11 is formed by the first film formation part 61; and another one of the multiple first magnetic layers 11 is formed by the second film formation part 62. The multiple first nonmagnetic layers 12 are formed by the third film formation part 63. Thereby, the consumed amount of the target easily becomes uniform between the first target 61a and the second target 62a. Also, for example, the first magnetic layer 11 and the second magnetic layer 21 that have more uniform characteristics are easily obtained. The electromagnetic wave attenuator and the electronic device in which the attenuation characteristics of the electromagnetic waves can be improved can be manufactured with higher productivity.

According to the embodiment, for example, when forming the second magnetic layer 21 or the third magnetic layer 31, a portion of the multiple first magnetic layers 11 may be formed by the first film formation part 61; and the remainder of the multiple first magnetic layers 11 may be formed by the second film formation part 62. In other words, electrical power may be applied to the targets Tg of the first and second film formation parts 61 and 62, and the electronic device 210 may be caused to pass through the film formation positions M1 and M2. Because the target of a magnetic material is a hard-to-sputter material and has a low film formation rate, it is possible to increase the film formation rate by operating multiple film formation parts.

According to embodiments, an electromagnetic wave attenuator, an electronic device, a film formation apparatus, and a film formation method can be provided in which the attenuation characteristics of the electromagnetic waves can be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in electromagnetic wave attenuators or electronic devices such as members, magnetic layers, nonmagnetic layers, electronic elements, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all electromagnetic wave attenuators, electronic devices, film formation apparatuses, and film formation methods practicable by an appropriate design modification by one skilled in the art based on the electromagnetic wave attenuators, the electronic devices, the film formation apparatuses and the film formation methods described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A film formation apparatus,
the apparatus being configured to form an electromagnetic wave attenuator, the attenuator including a first structure body,
the first structure body including
a first member in which a plurality of first magnetic layers and a plurality of first nonmagnetic layers are alternately stacked, and
a second member in which a plurality of second magnetic layers and a plurality of second nonmagnetic layers are alternately stacked,
a thickness of one of the plurality of first magnetic layers being greater than a thickness of one of the plurality of second magnetic layers,
the apparatus comprising:
a container configured to maintain an atmosphere depressurized from atmospheric pressure;
a first film formation part, a second film formation part, and a third film formation part, the first, second, and third film formation parts being provided in the container, the first, second, and third film formation parts including a sputter source to form the electromagnetic wave attenuator by depositing a film formation material on a processing body by sputtering;
a transfer part provided in the container, the transfer part being configured to circulatively transfer the processing body in a circumferential trajectory to the first film formation part, the second film formation part, and the third film formation part; and
a controller configured to control the first, second and third film formation parts, and the transfer part,
when forming one of the plurality of first magnetic layers, the controller being configured to
cause the transfer part to circulatively transfer the processing body to the first film formation part and the second film formation part,
cause the first film formation part to form a part of the one of the plurality of first magnetic layers, and cause the second film formation part to form remaining portion the one of the plurality of first magnetic layers, cause the transfer part to circulatively transfer the processing body to the third film formation part after the forming the one of the plurality of first magnetic layers, and cause the third film formation part to form one of the plurality of first nonmagnetic layers, and when forming one of the plurality of second magnetic layers, the controller being configured to cause the transfer part to circulatively transfer the processing body to the first film formation part and the second film formation part, cause the first film formation part to form the one of the plurality of second magnetic layers and cause the second film formation part to form an other one of the plurality of second magnetic layers, cause the transfer part to circulatively transfer the processing body to the third film formation part after the forming the one of the plurality of second magnetic layers, and cause the third film formation part to form one of the plurality of second nonmagnetic layers.

2. The apparatus according to claim 1, further comprising:
a partition part partitioning a film formation position at which the processing body is formed by the sputter sources of the first, second, and third film formation parts,
the controller causes the processing body to a pass through a film formation position at which film formation of one type of film formation material is performed while depositing the one type of film formation material on the processing body, causes the processing body to pass through a region other than the film formation position at which the film formation of the one type of film formation material is performed, and causes the processing body to again reach the film formation position at which the film formation of the one type of film formation material is performed.

3. The film formation apparatus according to claim 1, wherein
a number of one of formations of the first magnetic layers and formations of the second magnetic layers is detected, and
the one of formations of the first magnetic layers and formations of the second magnetic layers is stopped when the number reaches a determined value.

4. The film formation apparatus according to claim 1, wherein
a number of formations of at least one of the first magnetic layers or the first nonmagnetic layers is detected, and
the formations of the first member is stopped when the number of formation of the first magnetic layer or the number of formation of the first nonmagnetic layer reaches a determined value.

5. The film formation apparatus according to claim 1, wherein
a number of formations of at least one of the second magnetic layers or the second nonmagnetic layers is detected, and
the formations of the second member is stopped when the number of formation of the second magnetic layer or the number of formation of the second nonmagnetic layer reaches a determined value.

6. The film formation apparatus according to claim 1, wherein the first structure body further includes a third member in which a plurality of third magnetic layers and a plurality of third nonmagnetic layers are alternately stacked,
the controller is further configured to cause at least one of the first film formation part, the second film formation part, or a third film formation part form the plurality of third magnetic layers,
a number of formations of at least one of the third magnetic layers or the third nonmagnetic layers is detected, and
the formations of the third member is stopped when the number of formation of the third magnetic layer or the number of formation of the third nonmagnetic layer reaches a determined value.

7. A film formation apparatus,
the apparatus being configured to form an electromagnetic wave attenuator, the attenuator including a first structure body,
the first structure body including
a first member in which a plurality of first magnetic layers and a plurality of first nonmagnetic layers are alternately stacked, and
a second member in which a plurality of second magnetic layers and a plurality of second nonmagnetic layers are alternately stacked,
a thickness of one of the plurality of first magnetic layers being greater than a thickness of one of the plurality of second magnetic layers,
the apparatus comprising:
a container configured to maintain an atmosphere depressurized from atmospheric pressure;
a first film formation part, a second film formation part, and a third film formation part, the first, second, and third film formation parts being provided in the container, the first, second, and third film formation parts including a sputter source to form the electromagnetic wave attenuator by depositing a film formation material on a processing body by sputtering;
a transfer part provided in the container, the transfer part being configured to circulatively transfer the processing body in a circumferential trajectory to the first film formation part, the second film formation part, and the third film formation part; and
a controller configured to control the first, second and third film formation parts, and the transfer part,
when forming one of the plurality of first magnetic layers, the controller being configured to
cause the transfer part to circulatively transfer the processing body to the first film formation part or the second film formation part,
cause the first film formation part to form the one of the plurality of first magnetic layers, or cause the second film formation part to form the one of the plurality of first magnetic layers,
cause the transfer part to circulatively transfer the processing body to the third film formation part after the forming the one of the plurality of first magnetic layers, and
cause the third film formation part to form one of the plurality of first nonmagnetic layers, and
when forming one of the plurality of second magnetic layers, the controller being configured to
cause the transfer part to circulatively transfer the processing body to the first film formation part or the second film formation part, cause the first film formation part to form the one of the plurality of second magnetic layers, or cause the second film formation part to form the one of the plurality of second magnetic layers, cause the transfer part to circulatively transfer the processing body to the third film formation part after the forming the one of the plurality of second magnetic layers, and cause the third film formation part to form one of the plurality of second nonmagnetic layers, and a formation time of the one of the plurality of first magnetic layers being longer than a formation time of the one of the plurality of second magnetic layers.

8. The film formation apparatus according to claim 7, wherein
the first magnetic layers and the second magnetic layers are formed by alternately using the first film formation part and the second film formation part.

9. The film formation apparatus according to claim 7, wherein
a number of formations of at least one of the first magnetic layers or the first nonmagnetic layers is detected, and
the formations of the first member is stopped when the number of formation of the first magnetic layer or the number of formation of the first nonmagnetic layer reaches a determined value.

10. The film formation apparatus according to claim 7, wherein
a number of formations of at least one of the second magnetic layers or the second nonmagnetic layers is detected, and
the formations of the second member is stopped when the number of formation of the second magnetic layer or the number of formation of the second nonmagnetic layer reaches a determined value.

11. The film formation apparatus according to claim 7, wherein
the first structure body further includes a third member in which a plurality of third magnetic layers and a plurality of third nonmagnetic layers are alternately stacked,
the controller is further configured to cause at least one of the first film formation part, the second film formation part, or a third film formation part form the plurality of third magnetic layers,
a number of formations of at least one of the third magnetic layers or the third nonmagnetic layers is detected, and
the formations of the third member is stopped when the number of formation of the third magnetic layer or the number of formation of the third nonmagnetic layer reaches a determined value.

12. A film formation apparatus,
the apparatus being configured to form an electromagnetic wave attenuator, the attenuator including a first structure body,
the first structure body including
a first member in which a plurality of first magnetic layers and a plurality of first nonmagnetic layers are alternately stacked, and
a second member in which a plurality of second magnetic layers and a plurality of second nonmagnetic layers are alternately stacked,
a thickness of one of the plurality of first magnetic layers being greater than a thickness of one of the plurality of second magnetic layers, the apparatus comprising:
a container configured to maintain an atmosphere depressurized from atmospheric pressure;
a first film formation part or a second film formation part, and a third film formation part, the first or second formation part and the third film formation part being provided in the container, the first or second film formation part and the third film formation part including a sputter source to form the electromagnetic wave attenuator by depositing a film formation material on a processing body by sputtering;
a transfer part provided in the container, the transfer part being configured to circulatively transfer the processing body in a circumferential trajectory to the first film formation part or the second film formation part, and the third film formation part; and
a controller configured to control the first or second film formation part, the third film formation part, and the transfer part,
when forming one of the plurality of first magnetic layers, the controller being configured to
cause the transfer part to circulatively transfer the processing body to the first film formation part or the second film formation part,
cause the first film formation part to form the one of the plurality of first magnetic layers, or cause the second film formation part to form the one of the plurality of first magnetic layers,
cause the transfer part to circulatively transfer the processing body to the third film formation part after the forming the one of the plurality of first magnetic layers, and
cause the third film formation part to form one of the plurality of first nonmagnetic layers, and
when forming one of the plurality of second magnetic layers, the controller being configured to
cause the transfer part to circulatively transfer the processing body to the first film formation part or the second film formation part,
cause the first film formation part to form the one of the plurality of second magnetic layers, or cause the second film formation part to form the one of the plurality of second magnetic layers,
cause the transfer part to circulatively transfer the processing body to the third film formation part after the forming the one of the plurality of second magnetic layers, and
cause the third film formation part to form one of the plurality of second nonmagnetic layers, and
a formation time of the one of the plurality of first magnetic layers being longer than a formation time of the one of the plurality of second magnetic layers.

13. The film formation apparatus according to claim 12, wherein
a number of formations of at least one of the first magnetic layers or the first nonmagnetic layers is detected, and
the formations of the first member is stopped when the number of formation of the first magnetic layer or the number of formation of the first nonmagnetic layer reaches a determined value.

14. The film formation apparatus according to claim 13, wherein
the first structure body further includes a third member in which a plurality of third magnetic layers and a plurality of third nonmagnetic layers are alternately stacked, the controller is further configured to cause at least one of the first film formation part, the second film formation part, or a third film formation part form the plurality of third magnetic layers, a number of formations of at least one of the third magnetic layers or the third nonmagnetic layers is detected, and the formations of the third member is stopped when the number of formation of the third magnetic layer or the number of formation of the third nonmagnetic layer reaches a determined value.

15. The film formation apparatus according to claim 12, wherein a number of formations of at least one of the second magnetic layers or the second nonmagnetic layers is detected, and the formations of the second member is stopped when the number of formation of the second magnetic layer or the number of formation of the second nonmagnetic layer reaches a determined value.

* * * * *

UNITED STATES PATENT AND TRADEMARK OFFICE
CERTIFICATE OF CORRECTION

PATENT NO. : 12,224,250 B2
APPLICATION NO. : 18/328892
DATED : February 11, 2025
INVENTOR(S) : Hisashi Nishigaki et al.

Page 1 of 1

It is certified that error appears in the above-identified patent and that said Letters Patent is hereby corrected as shown below:

In the Specification

Column 11, Line 44, "more than atomic %;" should be --more than 5 atomic%;--

Signed and Sealed this
Twenty-second Day of July, 2025

Coke Morgan Stewart
*Acting Director of the United States Patent and Trademark Office*